US011025884B2

(12) United States Patent
Tamaki et al.

(10) Patent No.: US 11,025,884 B2
(45) Date of Patent: Jun. 1, 2021

(54) IMAGE CAPTURING APPARATUS, CONTROL METHOD THEREOF, AND STORAGE MEDIUM

(71) Applicant: CANON KABUSHIKI KAISHA, Tokyo (JP)

(72) Inventors: Yoshihito Tamaki, Yokohama (JP); Hideyuki Hamano, Kawasaki (JP); Akihiko Kanda, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/683,355

(22) Filed: Nov. 14, 2019

(65) Prior Publication Data

US 2020/0162718 A1    May 21, 2020

(30) Foreign Application Priority Data

Nov. 16, 2018    (JP) .............................. JP2018-215785

(51) Int. Cl.
| | |
|---|---|
| *H04N 13/207* | (2018.01) |
| *H04N 5/235* | (2006.01) |
| *G06T 7/00* | (2017.01) |
| *G03B 9/42* | (2021.01) |
| *H04N 13/296* | (2018.01) |

(52) U.S. Cl.
CPC ............. *H04N 13/207* (2018.05); *G03B 9/42* (2013.01); *G06T 7/0002* (2013.01); *H04N 5/2353* (2013.01); *H04N 13/296* (2018.05); *G06T 2207/10028* (2013.01); *G06T 2207/30168* (2013.01)

(58) Field of Classification Search
None
See application file for complete search history.

(56) References Cited

U.S. PATENT DOCUMENTS

| | | | | |
|---|---|---|---|---|
| 2011/0018971 | A1* | 1/2011 | Hasegawa | ............ H04N 5/2251 348/47 |
| 2011/0164166 | A1* | 7/2011 | Oikawa | .............. H04N 5/23212 348/340 |
| 2012/0076484 | A1* | 3/2012 | Takada | .................. G03B 7/095 396/324 |

(Continued)

FOREIGN PATENT DOCUMENTS

| | | |
|---|---|---|
| JP | 5917125 B | 5/2016 |
| JP | 6116301 B | 4/2017 |

*Primary Examiner* — John W Miller
*Assistant Examiner* — Sean N. Haiem
(74) *Attorney, Agent, or Firm* — Cowan, Liebowitz & Latman, P.C.

(57) ABSTRACT

An image capturing apparatus has an image sensor and a mechanical shutter; a generation unit configured to generate a parallax image from signals acquired from the plurality of photoelectric converters, wherein by the image sensor and the mechanical shutter, a first shutter operation by a first front curtain and a first rear curtain, and a second shutter operation by a second front curtain and a second rear curtain are realized, and the generating unit generates more parallax images than the number of the plurality of photoelectric conversion units by using a first signal group acquired by the first shutter operation and a second signal group acquired by the second shutter operation.

15 Claims, 12 Drawing Sheets

(56) References Cited

U.S. PATENT DOCUMENTS

| | | | | |
|---|---|---|---|---|
| 2013/0155269 A1* | 6/2013 | Fukuda | ................ | H04N 5/272 |
| | | | | 348/222.1 |
| 2013/0314510 A1* | 11/2013 | Endo | .................. | H04N 13/296 |
| | | | | 348/49 |
| 2014/0028806 A1* | 1/2014 | Endo | ...................... | G02B 7/34 |
| | | | | 348/49 |
| 2014/0253753 A1* | 9/2014 | Fukuda | ............ | H04N 5/23212 |
| | | | | 348/222.1 |
| 2017/0230567 A1* | 8/2017 | Takao | ................ | H04N 5/3456 |

\* cited by examiner

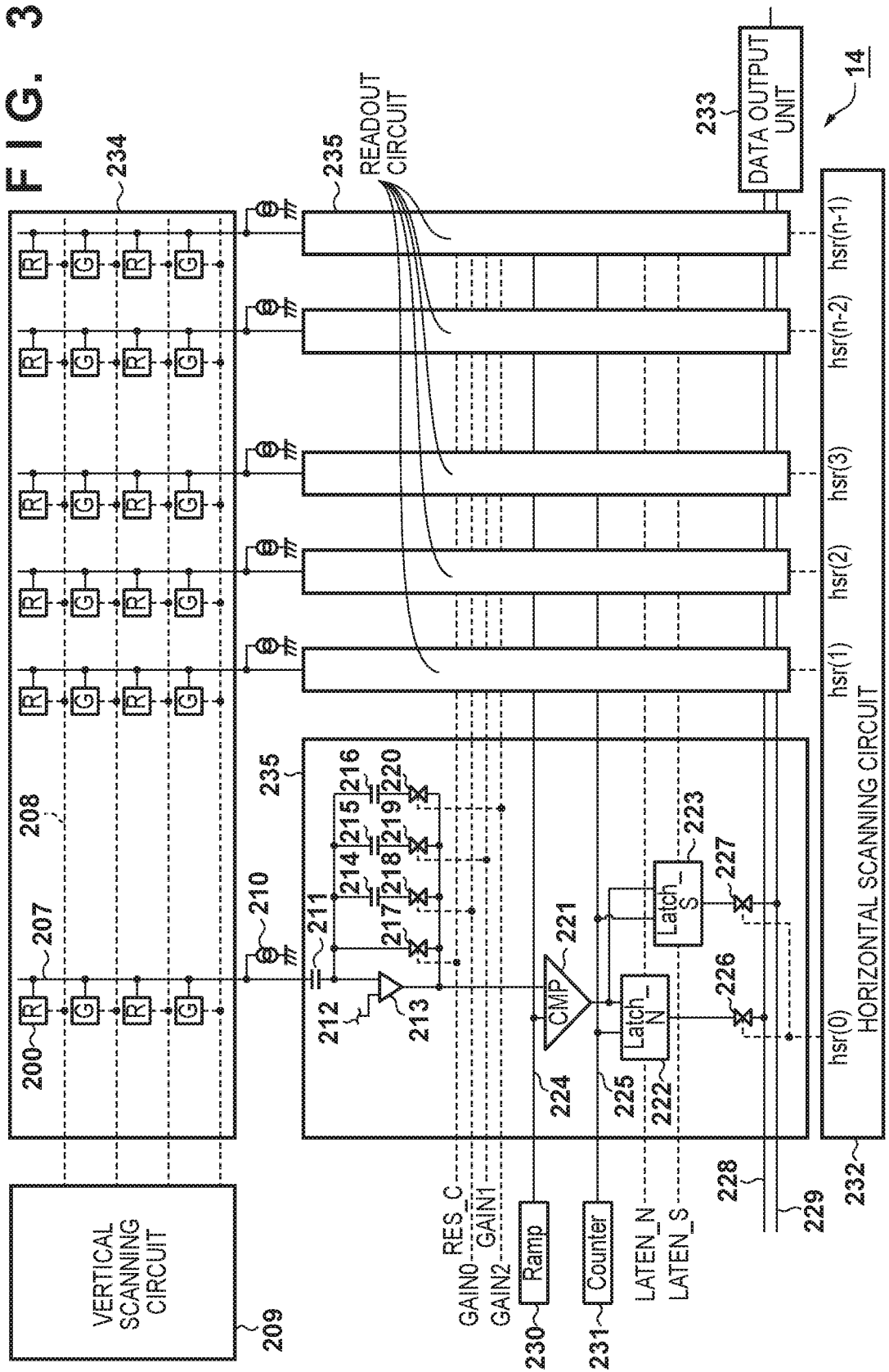

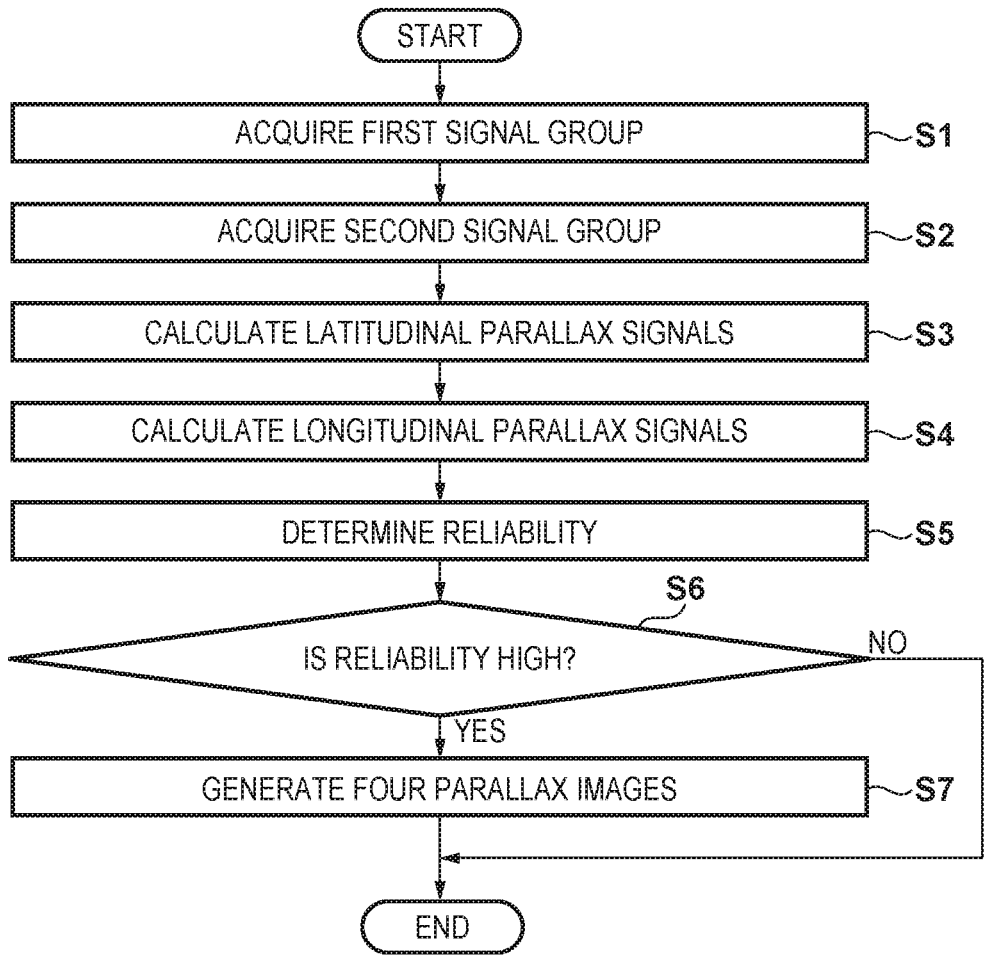
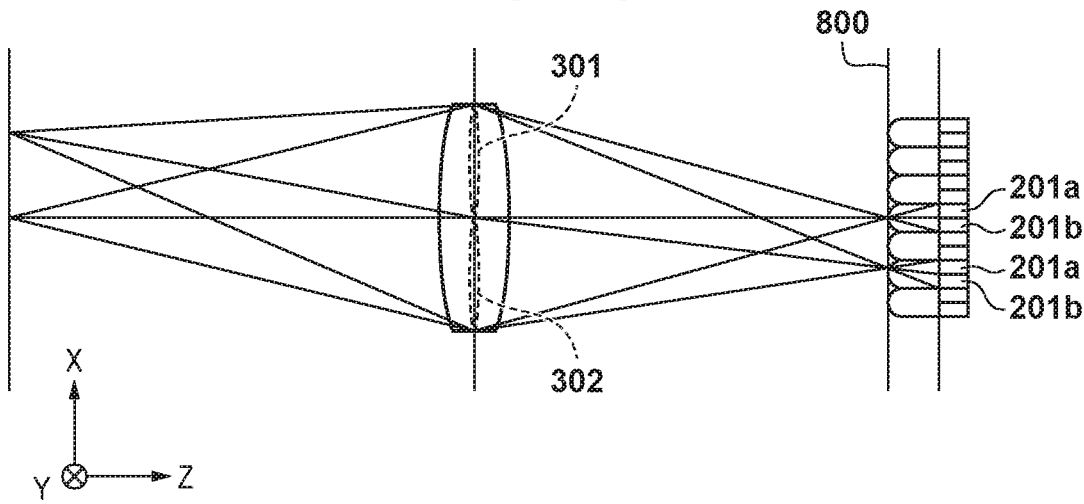

FIG. 7B
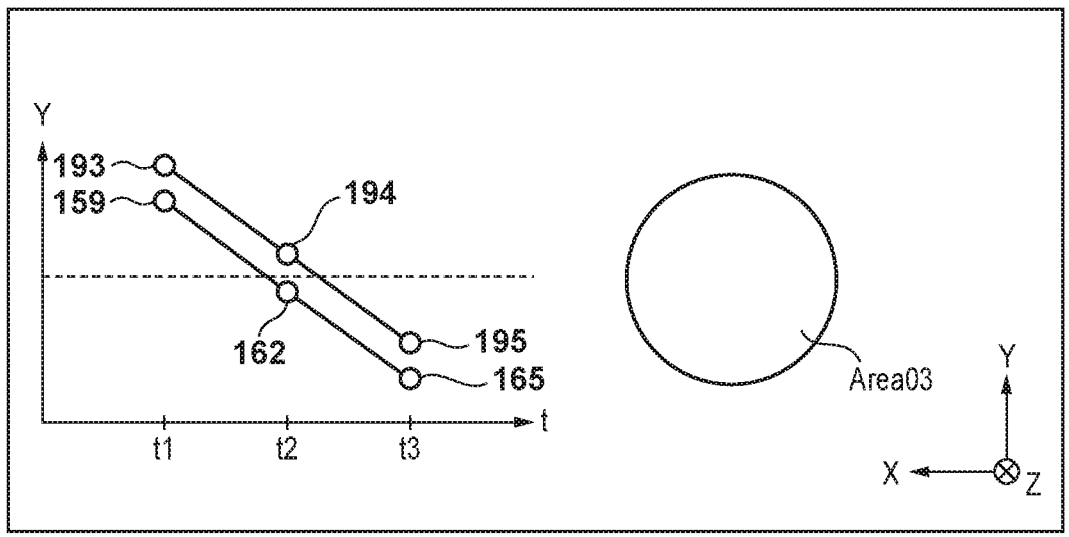
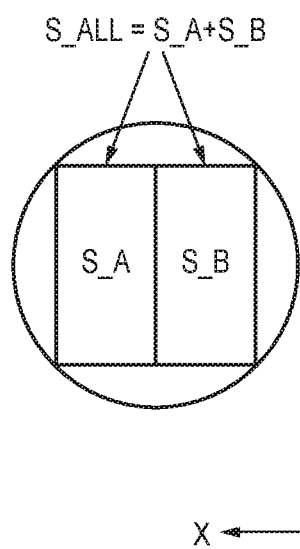
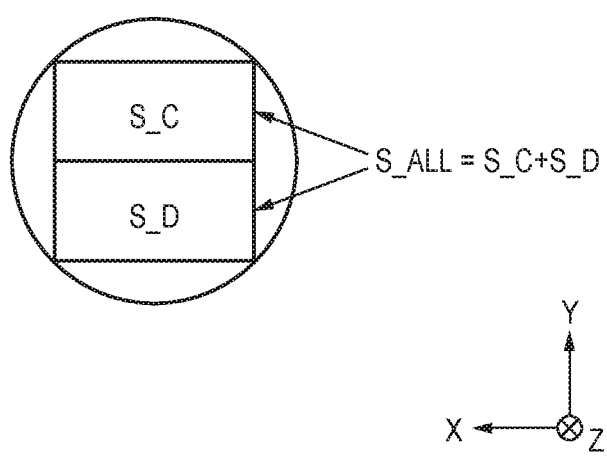
FIG. 8A     FIG. 8B

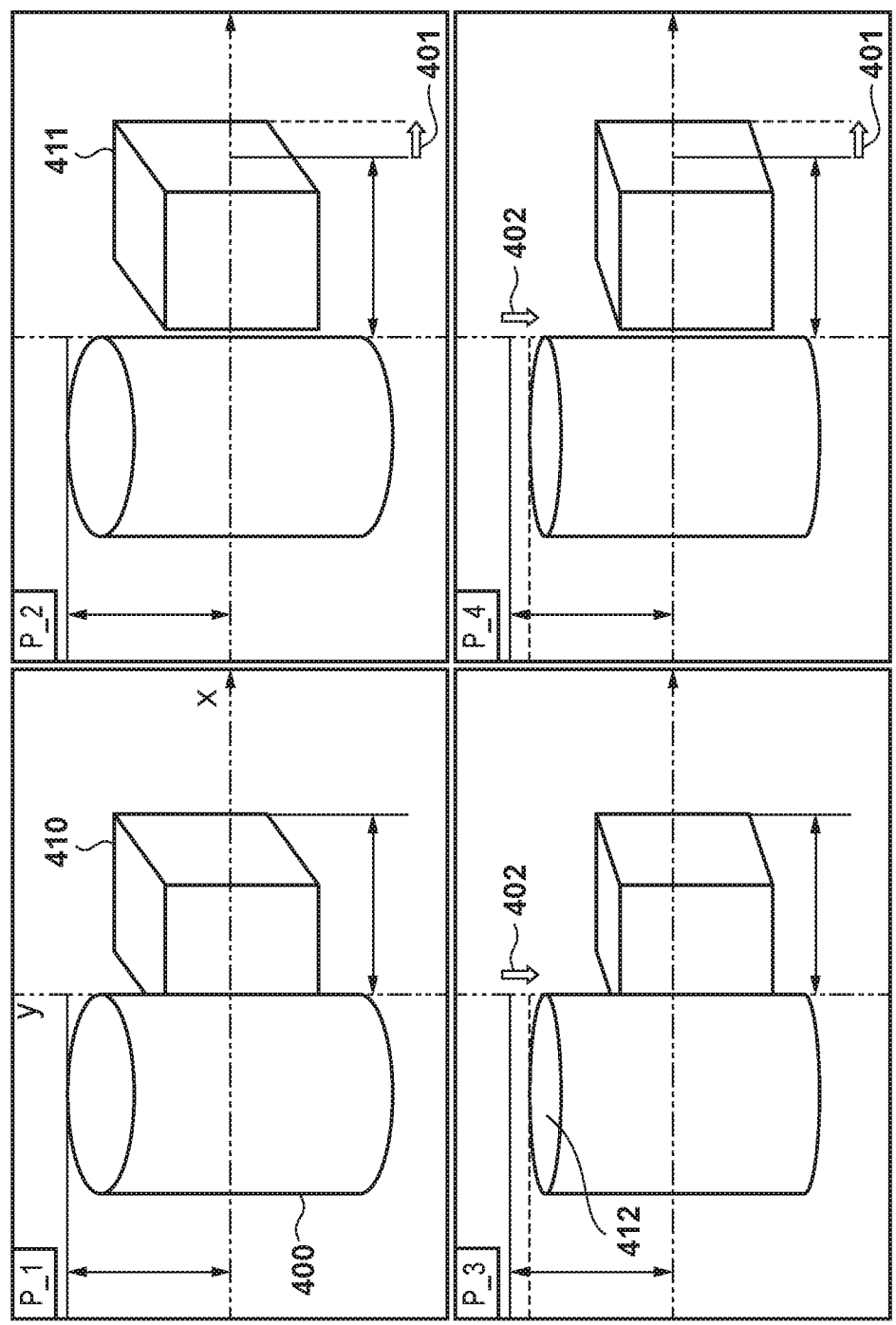

IMAGE CAPTURING APPARATUS, CONTROL METHOD THEREOF, AND STORAGE MEDIUM

BACKGROUND OF THE INVENTION

Field of the Invention

The present invention relates to an image capturing apparatus such as a digital camera.

Description of the Related Art

There has been proposed an image capturing apparatus capable of dividing an exit pupil of an image capturing lens into a plurality of pupil regions and simultaneously capturing a plurality of parallax images corresponding to the divided pupil regions.

Japanese Patent No. 6116301 discloses an image capturing apparatus using a two-dimensional image sensor in which one microlens and a photoelectric converter divided into two are formed in one pixel. The divided photoelectric converter is configured to receive light from different pupil partial regions of an exit pupil of an image capturing lens via one microlens, and performs pupil division. A plurality of parallax images corresponding to the divided pupil partial regions can be generated from the respective signals received by the divided photoelectric converters.

Japanese Patent No. 5917125 proposes an image processing apparatus that acquires a plurality of parallax images from a pixel group divided into a plurality of pixels in the horizontal direction and the vertical direction. A standard display apparatus for two-dimensional images can be used to stereoscopically display a plurality of acquired parallax images without reducing convenience.

However, Japanese Patent No. 6116301 is a configuration in which a pixel group is divided only in one direction and does not disclose a method in which a horizontal parallax and a vertical parallax are simultaneously acquired using the pixel group. In Japanese Patent No. 5917125, the parallax in the horizontal direction and the parallax in the vertical direction can be simultaneously acquired by using the pixel groups divided in the horizontal direction and the vertical direction, respectively. In order to realize a pixel group divided in the horizontal direction and the vertical direction without changing the pixel density, it is necessary to reduce the pixel size. However, there is a problem that electric circuits and the like associated with the pixel are increased in number due to the reduction in the size of the pixel, the wiring becomes complicated, and the technical difficulty and the cost are increased.

SUMMARY OF THE INVENTION

The present invention has been made in view of the above-described problems, and realizes an image capturing apparatus capable of acquiring both row direction parallax and column direction parallax of an image sensor even in a configuration in which pixels are divided in only one direction.

According to a first aspect of the present invention, there is provided an image capturing apparatus, comprising: an image sensor in which a plurality of pixels provided with a plurality of photoelectric converters for receiving luminous flux passing through different pupil regions of an imaging optical system are arranged; a mechanical shutter configured to shield the image sensor from light; and a generation circuit configured to generate a parallax image from signals acquired from the plurality of photoelectric converters, wherein the image sensor and the mechanical shutter realize: a first shutter operation by a first front curtain for starting exposure of a pixel, and a first rear curtain for ending the exposure of the pixel whose exposure was started by the first front curtain, the first rear curtain being arranged at a distance of a first shift amount from the first front curtain in a direction along an optical axis of the imaging optical system and a second shutter operation by a second front curtain for starting exposure of the pixel, and a second rear curtain for ending the exposure of the pixel whose exposure was started by the second front curtain, the second rear curtain being arranged at a distance of a second shift amount, which is smaller than the first shift amount, from the second front curtain in a direction along an optical axis of the imaging optical system, and the generation circuit generates more parallax images than the number of the plurality of photoelectric converters by using a first signal group acquired from the plurality of photoelectric converters by the first shutter operation and a second signal group acquired from the plurality of photoelectric converters by the second shutter operation.

According to a second aspect of the present invention, there is provided a method of controlling an image capturing apparatus having an image sensor in which a plurality of pixels provided with a plurality of photoelectric converters for receiving luminous flux passing through different pupil regions of an image forming optical system are arrayed, and a mechanical shutter for shielding the image sensor from light, the method comprising: by the image sensor and the mechanical shutter, performing a first shutter operation by a first front curtain for starting exposure of a pixel, and a first rear curtain for ending the exposure of the pixel whose exposure was started by the first front curtain, the first rear curtain being arranged at a distance of a first shift amount from the first front curtain in a direction along an optical axis of the imaging optical system, and a second shutter operation by a second front curtain for starting exposure of the pixel, and a second rear curtain for ending the exposure of the pixel whose exposure was started by the second front curtain, the second rear curtain being arranged at a distance of a second shift amount, which is smaller than the first shift amount, from the second front curtain in a direction along an optical axis of the imaging optical system; and generating a parallax image from signals acquired from the plurality of photoelectric converters, wherein the generating generates more parallax images than the number of the plurality of photoelectric converters by using a first signal group acquired from the plurality of photoelectric converters by the first shutter operation and a second signal group acquired from the plurality of photoelectric converters by the second shutter operation.

Further features of the present invention will become apparent from the following description of exemplary embodiments with reference to the attached drawings.

BRIEF DESCRIPTION OF THE DRAWINGS

FIG. 3 is a diagram illustrating an example of a configuration of the image sensor according to an embodiment of the present invention.

FIG. 4 is a flowchart of acquiring four parallax images according to an embodiment of the present invention.

FIG. 5 is a schematic diagram of pixel and pupil division in an embodiment of the present invention.

FIGS. 7A and 7B are diagrams for explaining a blurred image at the time of driving a second shutter operation in a first embodiment.

FIG. 8A and FIG. 8B are explanatory diagrams of pupil partial regions of a longitudinal parallax signal and a latitudinal parallax signal in the first embodiment.

FIG. 11 is a diagram illustrating an example of four parallax images in the first embodiment.

DESCRIPTION OF THE EMBODIMENTS

Exemplary embodiments of the present invention will be described below with reference to the drawings. It should be noted that although the embodiments have concrete and specific configurations in order to facilitate understanding and description of the invention, the present invention is not limited to such specific configurations. For example, an embodiment in which the present invention is applied to a single-lens reflex type digital camera for which a lens can be exchanged will be described below, but the present invention is also applicable to a single-lens type digital camera for which a lens can be exchanged or a type of digital camera for which a lens cannot be exchanged.

First Embodiment

Figure 1:
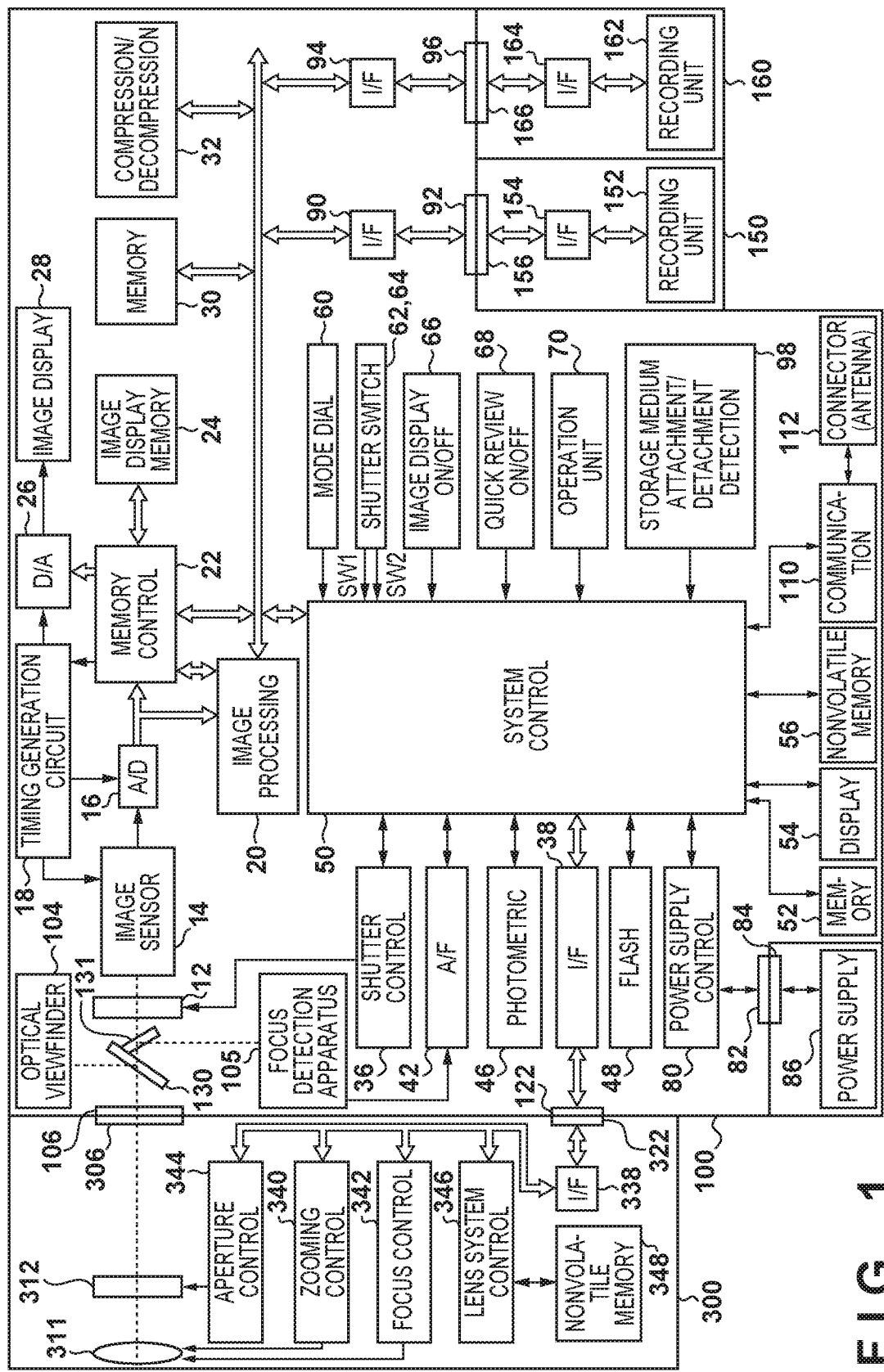
FIG. 1 is a block diagram illustrating an example of the functional configuration of an image capturing apparatus according to an embodiment of the present invention.

FIG. 1 is a diagram illustrating a configuration example of a camera system composed of a camera whose image capturing lens can be exchanged, and the image capturing lens, which is a first embodiment of an image capturing apparatus of the present invention. In FIG. 1, the camera system is configured to include a camera 100 and an exchangeable image capturing lens 300.

The luminous flux passing through the image capturing lens 300 passes through a lens mount 106, is reflected upward by a main mirror 130, and enters an optical viewfinder 104. The optical viewfinder 104 allows a photographer to perform capturing while observing an optical image of a subject. In the optical viewfinder 104, some functions of a display unit 54, for example, an in-focus display, a camera shake warning display, an aperture value display, an exposure correction display, and the like are installed.

A part of the main mirror 130 is composed of a semi-transmissive half mirror, and a part of the luminous flux incident on the main mirror 130 passes through this half mirror part, is reflected downward by a sub mirror 131, and enters a focus detection apparatus 105. The focus detection apparatus 105 is a focus detection apparatus of a phase-difference detection method having a secondary imaging optical system and a line sensor, and outputs a pair of image signals to an AF unit (autofocus unit) 42. The AF unit 42 performs a phase difference detection computation on the pair of image signals to obtain the defocus amount and direction for the image capturing lens 300. Based on the calculation result, a system control unit 50 controls a focus control unit 342 (described later) of the image capturing lens 300 to drive the focus lens.

When still image capturing is performed after the focus adjustment processing of the image capturing lens 300 is completed, or when an electronic finder display is performed, or when moving image capturing is performed, the main mirror 130 and the sub mirror 131 are retracted out of the optical path by a quick return mechanism (not illustrated). Accordingly, the luminous flux that passes through the image capturing lens 300 and enters the camera 100 can enter an image sensor 14 via a mechanical shutter 12 for controlling the exposure amount. After a capturing operation by the image sensor 14 is completed, the main mirror 130 and the sub mirror 131 return to the positions as illustrated in the view.

Here, a first shutter operation and a second shutter operation in the present embodiment will be described. The second shutter operation in the present embodiment is a shutter operation by an electronic shutter realized by the image sensor 14 and the system control unit 50, or is a shutter operation for controlling the exposure amount of the image sensor 14 by the running of a front curtain and a rear curtain of the mechanical shutter 12. The electronic shutter realized by the image sensor 14 and the system control unit 50 is a function in which the system control unit 50 is caused to perform exposure by controlling a reset timing at which charges of the image sensor 14 are sequentially reset in a driving direction (run direction) of the mechanical shutter 12, which will be described later. In the present embodiment, the shutter operation of the electronic shutter will be described by the expression "running", similarly to the operation of the shutter mechanism of the mechanical shutter 12. The mechanical shutter 12 is a shutter mechanism for forming a slit in the drive direction of the mechanical shutter by the front curtain and the rear curtain to perform exposure.

The first shutter operation in the present embodiment is a shutter mechanism for forming a slit and performing exposure by an electric charge reset of the front curtain in the electronic shutter function of the image sensor 14 and the rear curtain of the mechanical shutter 12. Note that the imaging plane in which the electronic shutter as the front curtain runs and the rear curtain of the mechanical shutter 12 have different positions in the direction along the optical axis. In the present embodiment, the front curtain is realized by the electronic shutter function, and the rear curtain is realized by the rear curtain of the mechanical shutter, but this may be reversed so that the front curtain is realized by the front curtain of the mechanical shutter, and the rear curtain is realized by the electronic shutter function.

The image sensor 14 is a CCD or a CMOS image sensor, and has a configuration in which a plurality of pixels having a plurality of photoelectric converters (or photodiodes) are two-dimensionally arranged. The image sensor 14 outputs an electrical signal corresponding to an optical image of a subject. An electric signal obtained by photoelectric conversion by the image sensor 14 is sent to an A/D converter 16, and an analog signal output is converted into a digital signal (image data). As will be described later, the A/D converter 16 may be incorporated in the image sensor 14.

At least some of the pixels of the image sensor 14 in the present embodiment are configured to have a plurality of photoelectric conversion regions (or photodiodes) as described above. As described in the description of the related art field, a pixel having such a configuration can output a signal used for focus detection of a phase-difference detection method. Therefore, even in a state in which the main mirror 130 and the sub mirror 131 are retracted out of the optical path by the quick return mechanism and the light does not enter the focus detection apparatus 105, the focus detection of the phase-difference detection method using the output of the image sensor 14 is possible.

In the present embodiment, parallax signals equal to or larger than the number of the plurality of photoelectric conversion regions in one pixel are acquired by using the two types of shutter operations of the first shutter operation and the second shutter operation described above. In the present embodiment, a latitudinal parallax image, which is a parallax image in the latitudinal direction on the page surface of FIG. 2B, is acquired and generated from a plurality of photoelectric conversion regions 201a and 201b in each of the pixels illustrated in FIG. 2B. Furthermore, longitudinal parallax images, which are parallax images in the longitudinal direction on the page surface of FIG. 2B, which is the driving direction of the shutter operation, are acquired and generated from two images acquired by the two types of shutter operations (the first shutter operation and the second shutter operation). The acquisition and generation of longitudinal parallax signal and the latitudinal parallax signal will be described later.

A timing generation circuit 18 supplies a clock signal and a control signal to the image sensor 14, the A/D converter 16, and a D/A converter 26. The timing generation circuit 18 is controlled by a memory control unit 22 and the system control unit 50. The system control unit 50 controls the timing generation circuit 18 to supply a control signal for reading out an output of a subset of the photoelectric conversion regions from a pixel having a plurality of photoelectric conversion regions or for performing an added readout of the output of all the photoelectric conversion regions to the image sensor 14.

An image processing unit 20 applies predetermined processing such as pixel interpolation processing, white balance adjustment processing, and color conversion processing to the image data from the A/D converter 16 or the image data from a memory control unit 22. The image processing unit 20 includes a parallax image generation unit, a reliability determination unit, a contrast information determination unit, a defocus information determination unit, an exposure amount determination unit, and an edge determination unit in the present embodiment.

The image processing unit 20 also generates a pair of signal sequences to be used for focus detection of the phase-difference detection method from an output signal used for generating a focus detection signal, out of the image data from the A/D converter 16 (an output signal of the image sensor 14). Thereafter, the pair of signal sequences is sent to the AF unit 42 via the system control unit 50. The AF unit 42 detects an amount of shift (shill amount) between the signal sequences by a correlation calculation on the pair of the signal sequences, and converts the shift amount into a defocus amount and a defocus direction for the image capturing lens 300. The AF unit 42 outputs the converted defocus amount and direction to the system control unit 50. The system control unit 50 drives the focus lens through the focus control unit 342 of the image capturing lens 300 to adjust the focal length of the image capturing lens 300.

In addition, the image processing unit 20 can calculate the contrast evaluation value based on a signal for generating normal image data obtained from the image sensor 14 (corresponds to a signal obtained by adding signals of a plurality of photoelectric converters in each pixel). The system control unit 50 performs capturing by the image sensor 14 while changing the focus lens position through the focus control unit 342 of the image capturing lens 300, and examines a change in the contrast evaluation value calculated by the image processing unit 20. Then, the system control unit 50 drives the focus lens to a position where the contrast evaluation value is a maximum. As described above, the camera 100 of the present embodiment is also capable of focus detection by the contrast detection method.

Therefore, even when the main mirror 130 and the sub mirror 131 are retracted out of the optical path as when performing a live view display or moving image capturing, the camera 100 can perform focus detection of both the phase-difference detection method and the contrast detection method on the basis of signal obtained from the image sensor 14. In addition, the camera 100 can perform focus detection of the phase-difference detection method by the focus detection apparatus 105 in normal still image capturing in which the main mirror 130 and the sub mirror 131 are in the optical path. As described above, the camera 100 can perform focus detection in any state during still image capturing, live view display, or moving image capturing.

The memory control unit 22 controls the A/D converter 16, the timing generation circuit 18, the image processing unit 20, an image display memory 24, the D/A converter 26, a memory 30, and a compression/decompression unit 32. The data of the A/D converter 16 is written into the image display memory 24 or the memory 30 via the image processing unit 20 and the memory control unit 22 or only via the memory control unit 22. Image data for display written in the image display memory 24 is displayed on an image display unit 28 composed of a liquid crystal monitor or the like via a D/A converter 26. By sequentially displaying moving images captured by the image sensor 14 on the image display unit 28, an electronic viewfinder function (live view display) can be realized. The image display unit 28 can turn on/off a display according to an instruction from the system control unit 50, and when the display is turned off, the power consumed by the camera 100 can be greatly reduced.

The memory 30 is used for temporary storage of captured still images and moving images, and has a storage capacity sufficient to store a predetermined number of still images and moving images for a predetermined period of time. As a result, even in the case of continuous shooting or panoramic shooting, high-speed and large-volume image writing can be performed on the memory 30. The memory 30 can also be used as a work area of the system control unit 50. The compression/decompression unit 32 has a function of compressing and decompressing image data by an adaptive discrete cosine transform (ADCT) or the like, reads an image stored in the memory 30, performs compression processing or decompression processing thereon, and writes back the processed image data to the memory 30.

A shutter control unit 36 controls the mechanical shutter 12 in cooperation with an aperture control unit 344 that controls an aperture 312 of the image capturing lens 300 based on photometric information from a photometry unit 46. An interface unit 38 and a connector 122 electrically connect the camera 100 and the image capturing lens 300.

These have a function of transmitting control signals, status signals, data signals, and the like between the camera 100 and the image capturing lens 300, and supplying currents of various voltages. In addition, configuration may be such that not only electric communication but also optical communication, voice communication, or the like are transmitted.

The photometry unit 46 performs automatic exposure control (AE) processing. The luminous flux passing through the image capturing lens 300 is made incident on the photometry unit 46 via the lens mount 106, the main mirror 130, and a photometric lens (not illustrated), whereby the luminance of the subject optical image can be measured. The photometry unit 46 can determine an exposure condition by using a program diagram or the like in which a luminance of a subject and the exposure condition are associated with each other. The photometry unit 46 also has a light adjustment processing function performed in cooperation with a flash 48. It is also possible for the system control unit 50 to perform AE control on the shutter control unit 36 and the aperture control unit 344 of the image capturing lens 300 based on a result of capturing image data of the image sensor 14 by the image processing unit 20. The flash 48 also has an AF auxiliary light projection function and a function for adjusting flash light.

The system control unit 50 includes a programmable processor such as a CPU or an MPU, and controls the operation of the entire camera system by executing a program stored in advance. A nonvolatile memory 52 stores constants, variables, programs, and the like for the operation of the system control unit 50. A display unit 54 is, for example, a liquid crystal display apparatus that displays an operation state, a message, and the like using characters, images, sounds, and the like in accordance with the execution of a program by the system control unit 50. The display unit 54 is installed at a position near the operation unit of the camera 100 where it is easy to see, for example, one or a plurality of display units 54 are formed by a combination of an LCD, an LED, and the like. Among the display contents of the display unit 54, information on the number of images captured, such as the number of images recorded and the remaining number of images that can be captured, information on imaging conditions such as shutter speed, aperture value, exposure correction, and flash, and the like are displayed on an LCD or the like. In addition, the remaining charge level, date, time, and the like are also displayed. As described above, some functions of the display unit 54 are installed in the optical viewfinder 104.

A nonvolatile memory 56 is an electrically erasable/recordable memory, and, for example, an EEPROM or the like is used. Reference numerals 60, 62, 64, 66, 68, and 70 denote operation units for inputting various operation instructions of the system control unit 50, and are composed of one or a combination of a plurality of switches, dials, touch panels, pointing by line-of-sight detection, speech recognition apparatuses, and the like.

A mode dial 60 can switch and set respective function modes such as a power-off mode, an automatic shooting mode, a manual shooting mode, a playback mode, and a PC connection mode. A shutter switch SW1 (62) is turned on when a shutter button (not illustrated) is half-pressed, and the shutter switch SW1 makes instructions to start operations such as AF processing, AE processing, AWB processing, and EF processing. A shutter switch SW2 (64) is turned on when the shutter button is fully-pressed, and the shutter switch SW2 makes instructions to start operations of a sequence of processes related to capturing. A series of processes relating to capturing is exposure processing, development processing, recording processing, and the like. In the exposure processing, a signal that is read out from the image sensor 14 is written as image data in the memory 30 via the A/D converter 16 and the memory control unit 22. In the development processing, development is performed using calculations in the image processing unit 20 and the memory control unit 22. In the recording process, image data is read from the memory 30, compressed by the compression/decompression unit 32, and written as image data to a recording medium 150 or 160.

An image display on/off switch 66 can turn the image display unit 28 on/off. With this function, when capturing is performed using the optical viewfinder 104, power saving can be achieved by cutting off the supply of current to the image display unit 28 which is composed of a liquid crystal monitor or the like. A quick review on/off switch 68 sets a quick review function for automatically playing back captured image data immediately after the image data is captured. An operation unit 70 includes various buttons, a touch panel, and the like. The various buttons include a menu button, a flash setting button, a single shooting/continuous shooting/self-timer switching button, an exposure correction button, and the like.

A power supply control unit 80 is configured by a battery detection circuit, a DC/DC converter, a switch circuit for switching blocks to be energized, and the like. The power supply control unit 80 detects whether or not a battery is mounted, the type of the battery, and remaining charge level of the battery, controls a DC/DC converter based on the detection results and an instruction from the system control unit 50, and supplies the required voltages to each unit including the recording mediums for a required period of time. Connectors 82 and 84 connect a power supply unit 86 consisting of a primary battery such as an alkaline battery or a lithium battery, a secondary battery such as a NiCd battery, an battery, or a lithium ion battery, and an AC adapter to the camera 100.

Interfaces 90 and 94 have a function of connecting with a recording medium such as a memory card or a hard disk, and connectors 92 and 96 physically connect with a recording medium such as a memory card or a hard disk. A recording medium attachment/detachment detection unit 98 detects whether or not a recording medium is attached to the connector 92 or 96. In the present embodiment, the interfaces and the connectors for attaching the recording mediums are described as being of two systems, but the interfaces and the connectors may be of a single system or may be of a configuration in which they include a plurality of systems. In addition, a configuration of interfaces and connectors of different standards may be provided in combination. Further, by connecting various communication cards such as a LAN card to an interface and a connector, it is possible to transfer image data and management information attached to the image data to and from other peripheral devices such as a computer and a printer.

A communication unit 110 has various communication functions such as wired communication and wireless communication. A connector 112 connects the camera 100 to other devices by the communication unit 110, and is an antenna in the case of wireless communication. The recording media 150 and 160 are memory cards, hard disks, or the like. The recording media 150 and 160 include recording units 152 and 162 composed of semiconductor memories, magnetic disks, or the like, interfaces 154 and 164 with the camera 100, and connectors 156 and 166 for connection with the camera 100.

Next, the image capturing lens 300 will be described. The image capturing lens 300 is mechanically and electrically coupled to the camera 100 by engaging a lens mount 306 with the lens mount 106 of the camera 100. Electrical coupling is achieved by the connector 122 and a connector 322 provided on the lens mount 106 and the lens mount 306. A lens 311 includes a focus lens for adjusting the focal length of the image capturing lens 300. The focus control unit 342 performs focus adjustment of the image capturing lens 300 by driving the focus lens along the optical axis. The operation of the focus control unit 342 is controlled by the system control unit 50 through a lens system control unit 346. The diaphragm 312 adjusts the amount and angle of the subject light incident on the camera 100.

The connector 322 and an interface 338 electrically connect the image capturing lens 300 to the connector 122 of the camera 100. Also, the connector 322 has a function of transmitting control signals, status signals, data signals, and the like between the camera 100 and the image capturing lens 300, and supplying currents of various voltages. Configuration may be such that the connector 322 transmits not only electric communication but also optical communication, voice communication, or the like.

A zoom control unit 340 drives a variable magnification lens of the lens 311 to adjust the focal length (angle of view) of the image capturing lens 300. If the image capturing lens 300 is a single focus lens, the zoom control unit 340 does not exist. The aperture control unit 344 controls the diaphragm 312 in cooperation with the shutter control unit 36 that controls the mechanical shutter 12 based on the photometric information from the photometry unit 46.

The lens system control unit 346 includes a programmable processor such as a CPU or an MPU, and controls the operation of the entire the image capturing lens 300 by executing a program stored in advance. The lens system control unit 346 has a memory function for storing constants, variables, programs, and the like for the operation of the image capturing lens. A nonvolatile memory 348 stores identification information such as a number unique to the image capturing lens, management information, function information such as a maximum aperture value, a minimum aperture value, a focal length, and the like, and current and past setting values. The above is the configuration of the camera system of the present embodiment that includes the camera 100 and the image capturing lens 300.

Next, the configuration of the image sensor 14 will be described with reference to FIGS. 2A and 2B and FIG. 3.

Figure 2A:
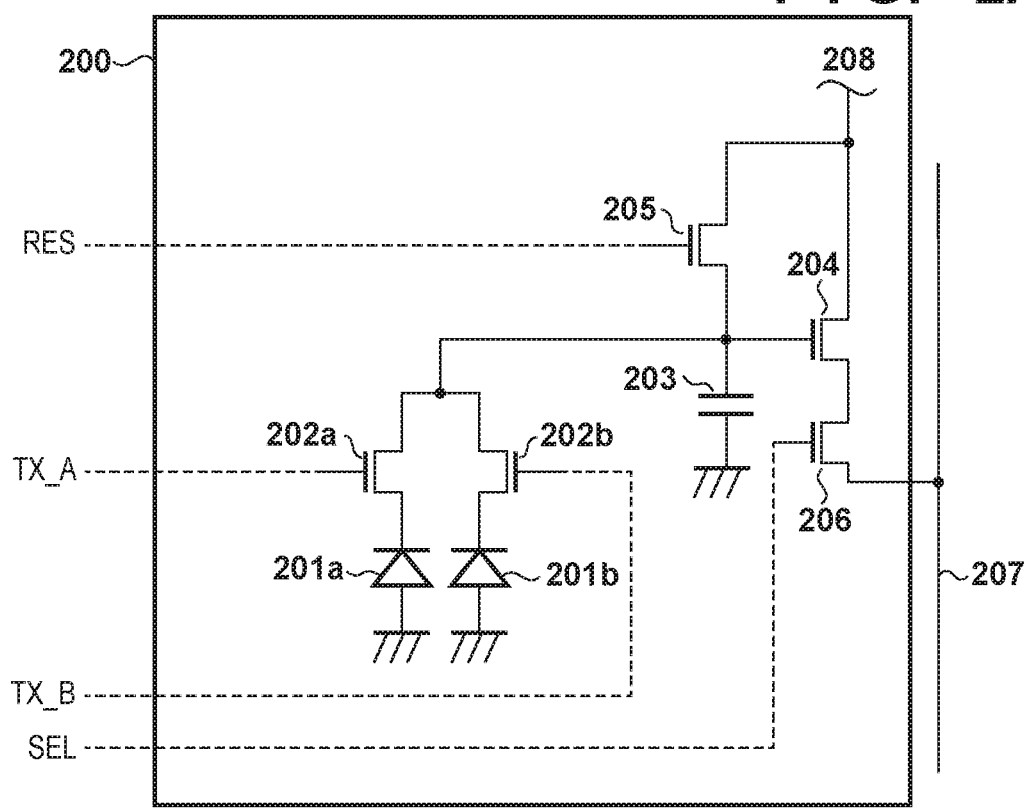
FIGS. 2A and 2B are schematic diagrams for an example of a pixel circuit configuration and a pixel arrangement according to an embodiment of the present invention.
Figure 2B:
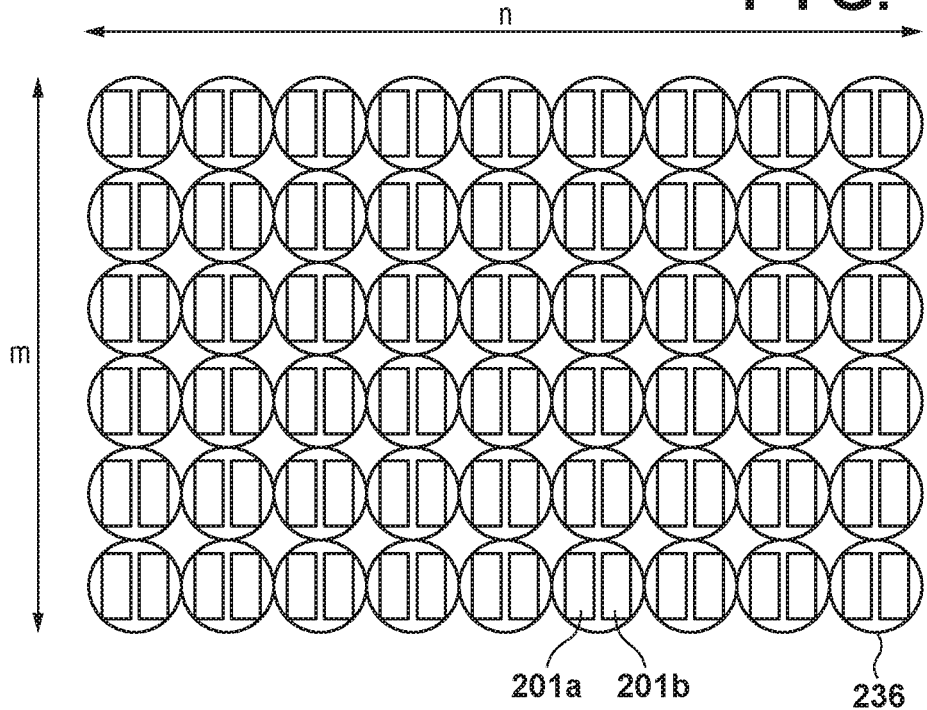

FIG. 2A illustrates an exemplary circuit configuration of a pixel of a plurality of pixels included in the image sensor 14, the pixel having a configuration capable of outputting signals used for focus detection of the phase-difference detection method. Here, a configuration in which two photodiodes (PDs) 201a and 201b are provided as a plurality of photoelectric conversion regions or photoelectric converters sharing a microlens in one pixel 200 will be described. As will be described later, the PD 201a (first photoelectric converter) and the PD 201b (second photoelectric converter) function as focus detection pixels and also function as imaging pixels. Hereinafter, a signal obtained from the PD 201a is referred to as an A signal, a signal obtained from the PD 201b is referred to as a B signal, and a signal obtained by adding the signal of the PD 201a and the signal of the PD 201b is referred to as an A+B signal.

Transfer switches 202a and 202b, the reset switch 205, and a selection switch 206 are composed of, for example, MOS transistors. In the following description, these switches are N-type MOS transistors, but they may be P-type MOS transistors or other switching elements.

FIG. 2B is a schematic diagram of a pixel array schematically illustrating n pixels horizontally and m pixels vertically among a plurality of pixels two-dimensionally arranged in the image sensor 14. Here, it is assumed that all the pixels have the structure illustrated in FIG. 2A. The pixels are provided with microlenses 236, and the PD 201a and 201b share the same microlens.

The transfer switch 202a is connected between the PD 201a and a floating diffusion (FD) 203. The transfer switch 202b is connected between the PD 201b and the FD 203. The transfer switches 202a and 202b are elements that transfer charges generated in the PD 201a and 201b, respectively, to a shared FD 203. The transfer switches 202a and 202b are controlled by control signals TX_A and TX_B, respectively.

The FD 203 functions as a charge-voltage converter (capacitor) which temporarily holds charge transferred from the PD 201a and the PD 201b and converts the held charge into voltage signals.

An amplifier 204 is a source follower MOS transistor. A gate of the amplifier 204 is connected to the FD 203, and a drain of the amplifier 204 is connected to a common power supply 208 that supplies a power supply potential VDD. The amplifier 204 amplifies the voltage signal based on electric charge held in the FD 203, and outputs the amplified voltage signal as an image signal.

A reset switch 205 is connected between the FD 203 and the common power supply 208. The reset switch 205 is controlled by a control signal RES, and the reset switch 205 has a function of resetting the potential of the FD 203 to the power supply potential VDD.

The selection switch 206 is connected between a source of the amplifier 204 and a vertical output line 207. The selection switch 206 is controlled by a control signal SEL, and outputs the image signal amplified by the amplifier 204 to the vertical output line 207.

FIG. 3 is a diagram illustrating an example of a configuration of the image sensor 14. The image sensor 14 includes a pixel array 234, a vertical scanning circuit 209, a current source load 210, a readout circuit 235, common output lines 228 and 229, a horizontal scanning circuit 232, and a data output unit 233. In the following description, all the pixels included in the pixel array 234 have the circuit configuration illustrated in FIG. 2A. However, some pixels may have a configuration in which one photodiode is provided per microlens.

The pixel array 234 includes a plurality of pixels 200 arranged in a matrix. In FIG. 3, the pixel array 234 is illustrated as having four rows and n columns to simplify the explanation. However, the number of rows and the number of columns of the pixels 200 included in the pixel array 234 is arbitrary. In the present embodiment, the image sensor 14 is a single-plate color image sensor, and has color filters arranged in a primary color Bayer array. Therefore, a pixel 200 is provided with any one of red (R), green (G), and blue (B) color filters. Note that there is no particular limitation on the colors or arrangement of the color filters. In addition, some pixels included in the pixel array 234 are shielded from light to form an optical black (OB) region.

The vertical scanning circuit 209 supplies various control signals illustrated in FIG. 2A to the pixels 200 of each row through driving signal lines 208 provided for each row. Note that in FIG. 3, the driving signal lines 208 for each row are represented by one line for easy understanding of the description, but actually, a plurality of driving signal lines exist for each row.

The pixels included in the pixel array 234 are connected to a common vertical output line 207 for each column. A current source load 210 is connected to each of the vertical output lines 207. A signal from each pixel 200 is input to a readout circuit 235 provided for each column through the vertical output line 207.

The horizontal scanning circuit 232 outputs control signals hsr(0) to hsr(n−1) corresponding to one readout circuit 235. The control signal hsr( ) selects one of the n readout circuits 235. The readout circuit 235 selected by the control signal hsr( ) outputs a signal to the data output unit 233 through the common output lines 228 and 229.

Next, a specific circuit configuration example of the readout circuit 235 will be described. FIG. 3 illustrates an example of the circuit configuration of one of the n readout circuits 235, but the other readout circuits 235 have the same configuration. The readout circuit 235 of the present embodiment includes a ramp-type AD converter.

The signals input to the readout circuit 235 through the vertical output line 207 are input to an inverting input terminal of an operational amplifier 213 through a clamp capacitor 211. A reference voltage Vref is supplied from a reference voltage source 212 to a non-inverting input terminal of the operational amplifier 213. Feedback capacitors 214 to 216 and the switches 218 to 220 are connected between the inverting input terminal and the output terminal of the operational amplifier 213. A switch 217 is further connected between the inverting input terminal and the output terminal of the operational amplifier 213. The switch 217 is controlled by a control signal RES_C, and has a function of shorting the two ends of the feedback capacitors 214 to 216. The switches 218 to 220 are controlled by control signals GAIN0 to GAIN2 from the system control unit 50.

An output signal of the operational amplifier 213 and a ramp signal 224 output from a ramp signal generator 230 are input to a comparator 221. Latch_N 222 is a storage element for holding a noise level (N signal), and the Latch_S is a storage element for holding the A signal and a signal level (A+B signal) obtained by adding the A signal to the B signal. The output (value representing the comparison result) of the comparator 221 and the output (counter value) 225 of the counter 231 are input to Latch_N 222 and Latch_S 223, respectively. The operations (enabled or disabled) of Latch_N 222 and Latch_S 223 are controlled by LATEN_N and LATEN_S, respectively. The noise level held by Latch_N 222 is output to the common output line 228 via the switch 226. The signal level held by Latch_S 223 is output to the common output line 229 via the switch 227. The common output lines 228 and 229 are connected to the data output unit 233.

The switches 226 and 227 are controlled by a control signal hsr(h) from the horizontal scanning circuit 232. Here, h indicates the column number of the readout circuit 235 to which the control signal line is connected. The signal levels held in Latch_N 222 and Latch_S 223 of the readout circuits 235 are sequentially output to the common output lines 238 and 229, and are output to the memory control unit 22 and the image processing unit 20 through the data output unit 233. The operation of sequentially outputting the signal levels held by the readout circuits 235 to the outside is referred to as horizontal transfer. Note that control signals (excluding hsr( )) input to the readout circuit and control signals of the vertical scanning circuit 209, the horizontal scanning circuit 232, the ramp signal generator 230, and the counter 231 are supplied from the timing generation circuit 18 and the system control unit 50.

Generation of four parallax images in the present embodiment will be described below with reference to FIGS. 4 to 11. In the present embodiment, four parallax images (S_1, S_2, S_3, S_4) divided into two in the vertical and horizontal directions respectively are calculated from latitudinal parallax signals S_A and S_B obtained by dividing the pupil region into two in a latitudinal direction and longitudinal parallax signals S_C and S_D obtained by dividing the pupil region into two in a longitudinal direction by a method described later.

FIG. 4 is a flowchart of generation of a four parallax images according to the present embodiment. In steps S1 and S2, the first signal group and the second signal group are acquired by using the first shutter operation and the second shutter operation described above. The first signal group and the second signal group are acquired by the PD 201a and PD 201b of FIG. 4, which are 1×2 divided for each pixel of the image sensor 14. The PD 201a and the PD 201b receive the luminous flux passing through different pupil partial regions (the pupil partial region 301 and the pupil partial region 302 illustrated in FIG. 5, respectively).

In step S1, the first shutter operation described above is used at high speed to acquire a first signal group obtained from the PD 201a and the PD 201b in FIG. 5. Describing the first shutter operation again, the first shutter operation is a method in which a slit is formed and exposure is performed by resetting the electric charge of the image sensor 14 as the front curtain and a rear curtain of the mechanical shutter 12. Here, the amount of light received in the longitudinal direction (Y direction in FIGS. 6A and 6B and FIGS. 7A and 7B) in the first signal group acquired when the first shutter operation is used at high speed will be described with reference to FIGS. 6A and 6B.

Figure 6A:
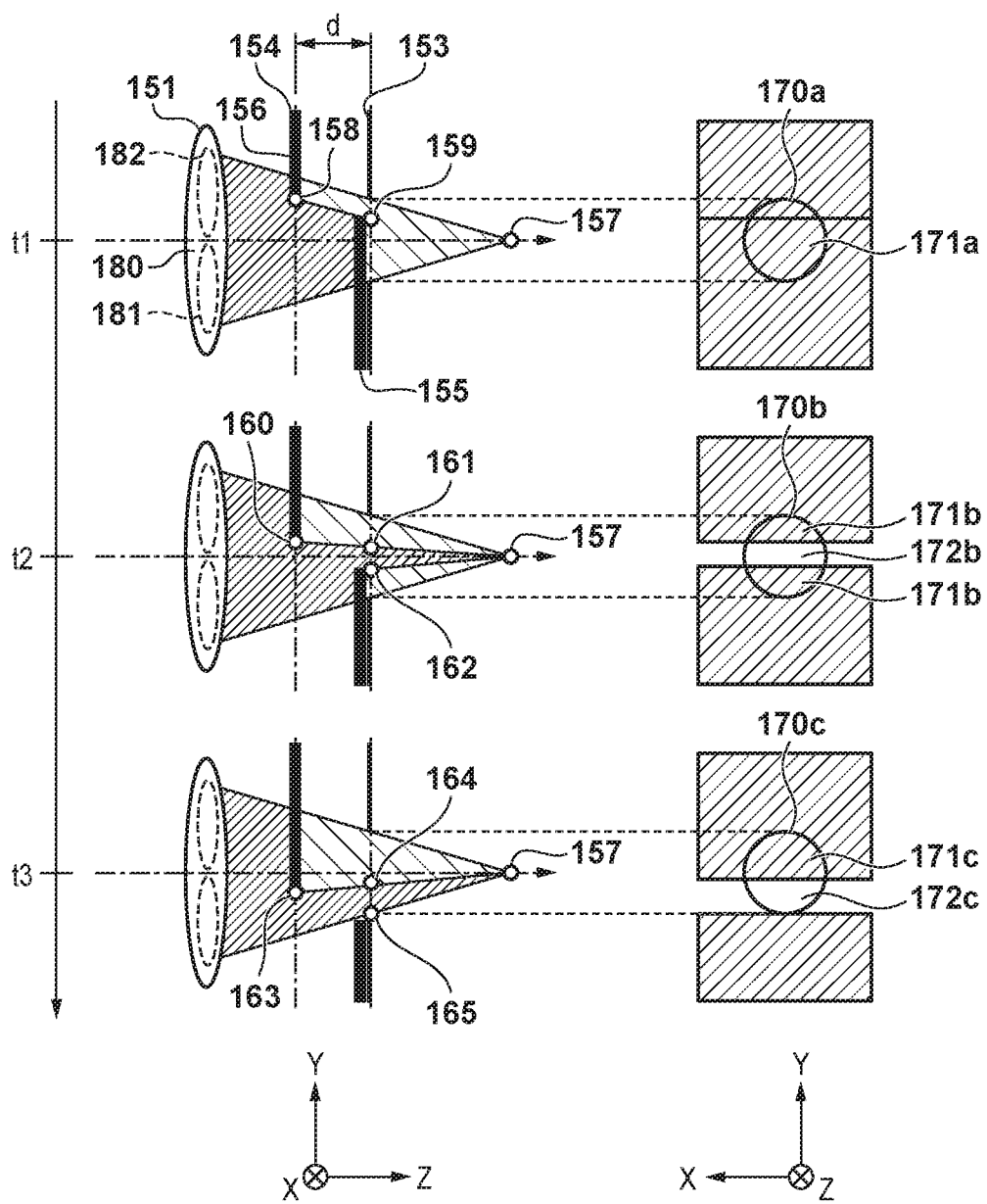
FIGS. 6A and 6B are diagrams for explaining a blurred image at the time of driving a first shutter operation in a first embodiment.
Figure 6B:
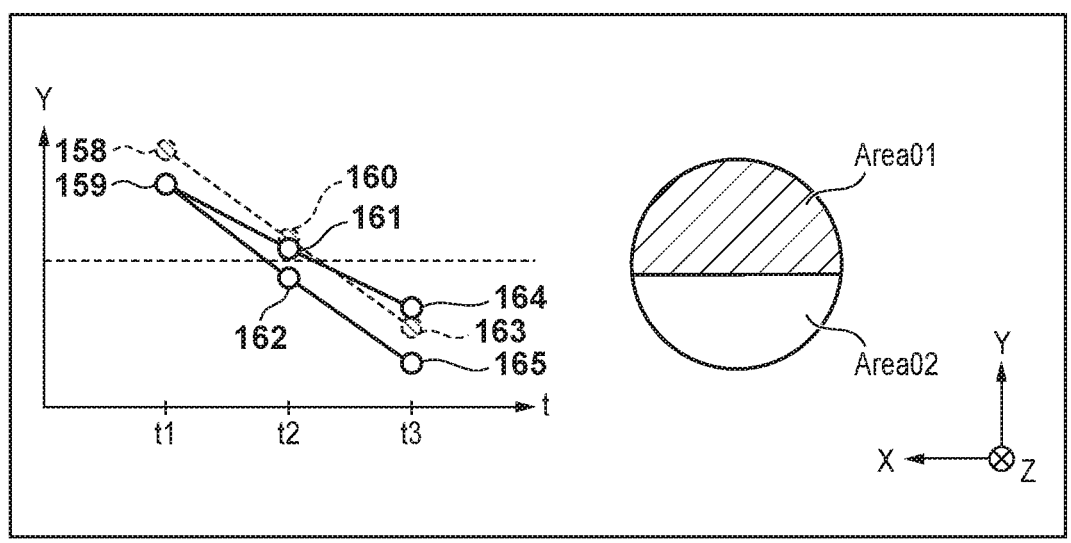

FIGS. 6A and 6B are diagrams schematically illustrating a state in which a blurred image is shielded by the first shutter operation when the focus position is positioned at a position 157 behind the image sensor plane at certain times (t1, t2, or t3). The driving direction of the first shutter operation is from the direction from the top to the bottom of the page surface. In the present embodiment, the first shutter operation is used at high speed to receive the luminous flux from the partial regions of the pupil and acquire a parallax signal in the longitudinal direction. Further, in FIGS. 6A and 6B, at times t1, t2, and t3, a state in which the first shutter operation blocks the luminous flux in the YZ plane is schematically illustrated on the left side, and a state of shielding and a blurred image on the image sensor plane 153 in the XY plane are schematically illustrated on the right side.

In the view on the left side of FIG. 6A, reference numerals 181 and 182 denote different partial regions of the pupil of a complex lens 151 of the optical system. Reference numeral 153 denotes an image sensor plane in which the electronic shutter of the present embodiment is driven. Reference numeral 154 denotes a mechanical shutter plane in which the mechanical shutter 12 of the present embodiment runs. Reference numeral 155 schematically illustrates a light shielding portion (electronic front curtain) according to a reset driving by the electronic shutter. Reference numeral 156 schematically illustrates a rear curtain (mechanical rear curtain) formed by the mechanical shutter 12. In this embodiment, the shutter operation using the electronic front curtain and the mechanical rear curtain is called an electronic front curtain shutter. In the electronic front curtain shutter, the electronic front curtain and the mechanical rear curtain are arranged apart from each other in the optical axis direction by a first amount of shift in the optical axis direction d.

In the views on the right side of FIG. 6A, reference numerals 170a, 170b, and 170c denote blurred images on the image sensor plane 153. Reference numerals 171a, 171b, and 171c denote portions where the blurred image described above is shielded by the electronic front curtain 155 or the mechanical rear curtain 156. Reference numerals 172b and 172c denote portions where the blurred image described above is not shielded by the electronic front curtain 155 or the mechanical rear curtain 156 (an opening at the time of the first shutter operation).

First, an explanation will be given with reference to the view for time t1 in FIG. 6A. At time t1, the upper end 159 of the electronic front curtain 155 is positioned in an upper portion of the blurred image formed on the image sensor plane 153, and the lower end 158 of the mechanical rear curtain 156 is positioned in an upper portion of the blurred image formed on the mechanical shutter plane 154. At this time, the luminous flux from the complex lens 151 is hardly blocked by the mechanical rear curtain 156, but is blocked by the electronic front curtain 155. The blurred image 170a on the image sensor plane 153 at this time is blocked by the electronic front curtain 155 as illustrated on the right side for time t1 in FIG. 6A.

Next, an explanation will be given with reference to the view for time t2 in FIG. 6A. At the time t2, the blurred image formed on the image sensor plane 153 is shielded by the lower end 160 of the mechanical rear curtain 156 and the upper end 162 of the electronic front curtain 155. At this time, an opening of the first shutter operation on the image sensor plane 153 is formed by 161 at which the lower end of the mechanical rear curtain 156 is projected onto the image sensor plane 153 and the upper end 162 of the electronic front curtain. The blurred image 170b on the image sensor plane 153 at this time forms an opening 172b as illustrated on the right side for time t2 in FIG. 6A, and other portions are partially obstructed by the electronic front curtain 155 and the mechanical rear curtain 156 (171b).

Next, an explanation will be given with reference to the view for time t3 in FIG. 6A. At the time t3, the blurred image formed on the image sensor plane 153 is shielded by the lower end 163 of the mechanical rear curtain 156 and the upper end 165 of the electronic front curtain 155. At this time, an opening of the first shutter operation on the image sensor plane 153 is formed by 164 at which the lower end of the mechanical rear curtain 156 is projected onto the image sensor plane 153 and the upper end 165 of the electronic front curtain. The blurred image 170c on the image sensor plane 153 at this time forms an opening 172c as illustrated on the right side for time t3 in FIG. 6A, and other portions are partially obstructed by the electronic front curtain 155 and the mechanical rear curtain 156 (171c).

As described above, when capturing using the first shutter operation is performed, the blurred image is shielded. Next, the manner in which the pupil of the complex lens is shielded will be described with reference to FIG. 6B.

FIG. 6B illustrates a temporal change of an opening formed by the electronic front curtain 155 and the mechanical rear curtain 156 on the image sensor plane 153 in FIG. 6A, and a blurred image on the image sensor plane 153 when the first shutter operation is used. In FIG. 6B, reference numerals 158 to 165 are the same as reference numerals 158 to 165 in FIG. 6A. The horizontal axis represents times t1, t2, and t3, and the vertical axis represents the position of the end portions of the light shielding portion in the Y direction in the camera. The opening at each time is illustrated on the vertical axis. First, consider the opening at time t1. At time t1, the luminous flux is blocked by the upper end 159 of the electronic front curtain 155 and the lower end 158 of the mechanical rear curtain 156. Since the lower end 158 of the mechanical rear curtain 156 is projected onto 159 of the image sensor plane 153, the opening in the image sensor plane 153 becomes 159-159, and all luminous flux is blocked.

Next, consider the opening at time t2. At time t2, the luminous flux is blocked by the upper end 162 of the electronic front curtain 155 and the lower end 160 of the mechanical rear curtain 156. Since the lower end 160 of the mechanical rear curtain 156 is projected onto 161 of the image sensor plane 153, the opening in the image sensor plane 153 becomes 161-162, and a part of the luminous flux is blocked. The opening 161-162 is narrower than the opening 160-162 before the mechanical rear curtain 156 is projected onto the image sensor plane 153.

Finally, consider the opening at time t3. At time t3, the luminous flux is blocked by the upper end 165 of the electronic front curtain 155 and the lower end 163 of the mechanical rear curtain 156. Since the lower end 163 of the mechanical rear curtain 156 is projected onto 164 of the image sensor plane 153, the opening in the image sensor plane 153 becomes 164-165, and a part of the luminous flux is blocked. The opening 164-165 is wider than the opening 163-165 before the mechanical rear curtain 156 is projected onto the image sensor plane 153. As a result, the amount of light is unbalanced, and the blurred image on the image sensor plane 153 is divided into a region Area01 that is shielded in the first shutter operation and a region Area02 that is not shielded. As described above, in the first signal group acquired when the first shutter operation is used at high speed, the received light distribution is not uniform in the Y direction. It can be considered that the luminous flux from the partial region 181 of the pupil of the complex lens 151 is being received.

In the above description, the case where the focus position is located at reference numeral 157 behind the image sensor plane has been described, but also in the case where the focus position is located in front of the image sensor plane, shielding occurs in the same manner. The angles of the luminous flux at which the shielding occurs are the same regardless of the focus position, but as a result, the shielding condition of the generated blurred image differs from the cases of FIGS. 6A and 6B. That is, the lower side (negative Y-axis direction) in the right side views of FIG. 6B are more shielded.

In step S2, the second shutter operation described above is used at the same high speed as in step S1 to acquire a second signal group obtained from the PD 201a and the PD 201b in FIG. 5. Describing the second shutter operation again, the second shutter operation is an electronic shutter realized by the image sensor 14 and the system control unit 50 or the mechanical shutter 12. In the second shutter operation, the amount of shift in the direction along the optical axis between the plane in which the front curtain runs and the plane in which the rear curtain runs is small as compared with the first shutter operation or zero. Here, the amount of light received in the longitudinal direction (Y direction in FIGS. 6A and 6B and FIGS. 7A and 7B) in a second signal group acquired when the second shutter operation is used at high speed will be described with reference to FIGS. 7A and 7B.

Figure 7A:
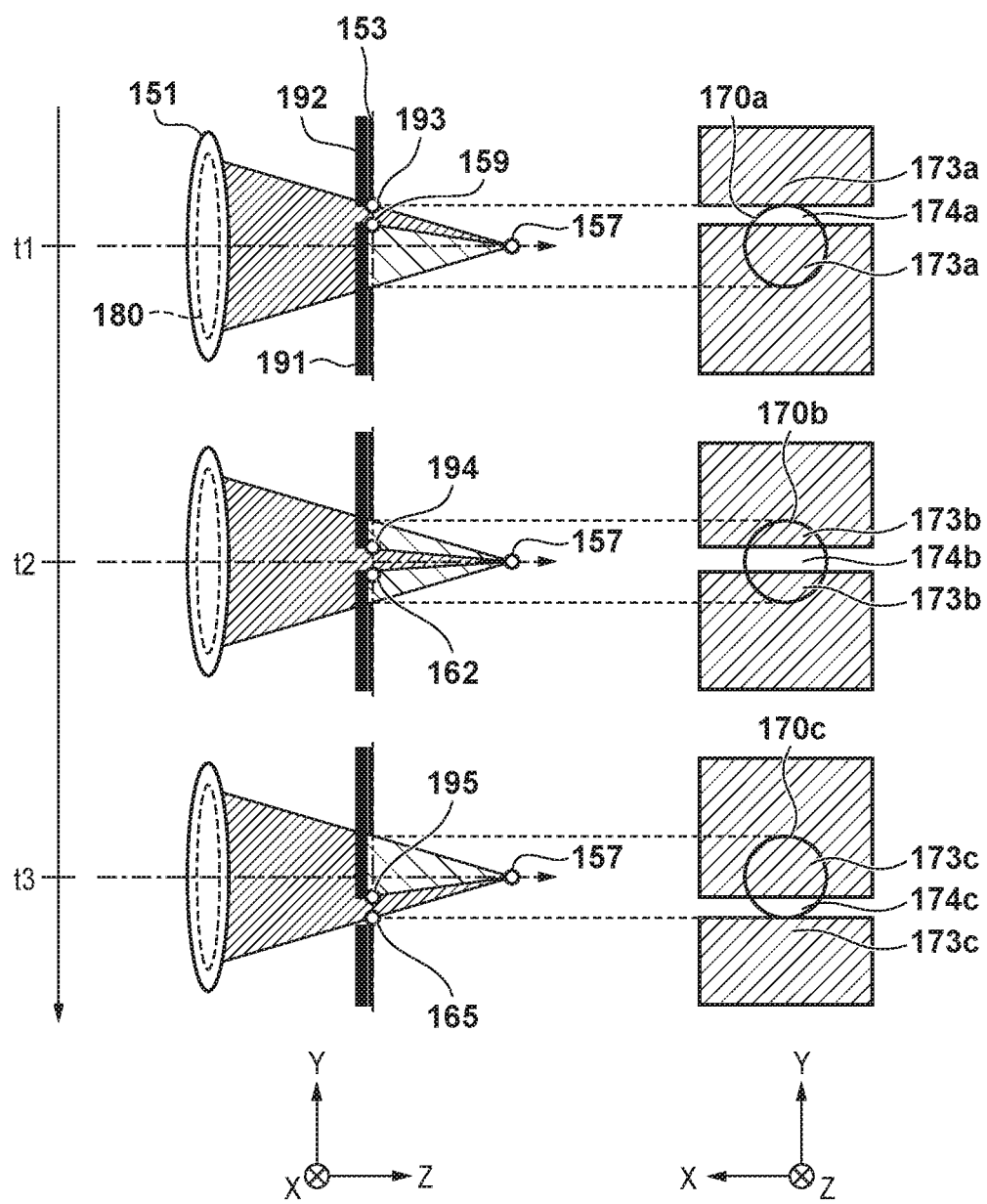

FIGS. 7A and 7B are diagrams schematically illustrating a state in which a blurred image is shielded by the second shutter operation when the focus position is positioned at a position 157 behind the image sensor plane at certain times (t1, t2, or t3). The driving direction (run direction) of the second shutter operation is the direction from the top to the bottom of the page surface. Further, in FIGS. 7A and 7B, at times t1, t2, and t3, a state in which the second shutter operation blocks the luminous flux in the YZ plane is schematically illustrated on the left side, and a state in which shielding and a blurred image on the image sensor plane 153 in the XY plane are schematically illustrated on the right side.

In FIGS. 7A and 7B, the second shutter operation will be described as light shielding portions 191 (electronic front curtain) and 192 (electronic rear curtain) according to a reset operation by the electronic shutter of the present embodiment. However, light shielding portions 191 (mechanical front curtain) and 192 (mechanical rear curtain) that use the mechanical shutter 12 may be employed as 191 and 192.

In the present embodiment, since the electronic front curtain and electronic rear curtain are described, the light shielding portions 191 (electronic front curtain) and 192 (electronic rear curtain) are not arranged so as to be shifted in the optical axis direction, and since the amount of shift in the optical axis direction is 0 (zero), the amount of shift in the optical axis direction between the light-shielding curtains is smaller than that of the first shutter operation. On the other hand, in the case of a mechanical front curtain and a mechanical rear curtain, although the light-shielding curtains are disposed to be away from the optical axis, the amount of shift in the optical axis direction is smaller than the amount of shift in the optical axis direction of the electronic front curtain and the mechanical rear curtain. Therefore, even with the mechanical front curtain and the mechanical rear curtain, the amount of shift in the optical axis direction between the light-shielding curtains is small.

In the view on the left side of FIG. 7A, reference numeral 180 denotes a pupil region of the complex lens 151 of the optical system. Reference numeral 153 denotes an image sensor plane in which the electronic shutter of the present embodiment is driven. Reference numeral 191 schematically illustrates a light shielding portion (electronic front curtain) according to a reset driving by the electronic shutter. Reference numeral 192 denotes a read completion operation in which reading of a signal performed after the reset driving by the electronic shutter is completed (electronic rear curtain). In the present embodiment, the read completion operation is schematically illustrated as operation of the rear curtain.

In the views on the right side of FIG. 7A, reference numerals 170a, 170b, and 170c denote blurred images on the image sensor plane 153. Reference numerals 173a, 173b, and 173c denote portions where the blurred image described above is shielded by the electronic front curtain 191 or the electronic rear curtain 192. Reference numerals 174a, 174b, and 174c denote portions where the blurred image described above is not shielded by the electronic front curtain 191 or the electronic rear curtain 192 (an opening of the second shutter operation).

First, an explanation will be given with reference to the view for time t1 in FIG. 7A. At time t1, the upper end of the electronic front curtain 191 is located at the upper end 159 of the blurred image formed on the image sensor plane 153, and the lower end of electronic rear curtain 192 is located at the upper end 193 of the blurred image formed on the image sensor plane 153. At this time, the luminous flux from the complex lens 151 is blocked by the electronic front curtain 191 and the electronic rear curtain 192. Most of the blurred image 170a on the image sensor plane 153 at this time is blocked by the electronic front curtain 191 and the electronic rear curtain 192 as illustrated on the right side for time t1 in FIG. 7A.

Thereafter, the luminous flux is blocked by the electronic front curtain 191 and the electronic rear curtain 192 in the same manner at the time t2 and the time t3 in FIG. 7A. When the second shutter operation is used, the opening 159-193 formed by the electronic front curtain and the electronic rear curtain at the time t1, the opening 162-194 at the time t2, and the opening 165-195 at the time t3 are equal to each other.

As described above, when capturing using the second shutter operation is performed, the blurred image is shielded. Next, the manner in which the pupil of the complex lens is shielded will be described with reference to the in FIG. 7B, FIG. 7B illustrates schematically a temporal change of an opening formed by the electronic front curtain 191 and the electronic rear curtain 192 on the image sensor plane 153 in FIG. 7A, and the pupil of the complex lens 151 in the case where the second shutter operation is used. In FIG. 7B, reference numerals 159 to 195 are the same as reference numerals 159 to 195 in FIG. 7A. The opening at each time is illustrated on the vertical axis. In FIG. 7B, unlike in FIG. 6B, since the electronic front curtain 191 and the electronic rear curtain 192 are located on the image sensor plane 153 (at the same position on the optical axis), the opening 159-193 at the time t1, the opening 162-194 at the time t2, and the opening 165-195 at the time t3 are equal to each other. As a result, the blurred image on the image sensor plane 153 is a non-shielded area Area03 in the second shutter operation. Luminous flux from the pupil region 180 of the complex lens 151 is being received. As described above, in the second signal group acquired when the second shutter operation is used at high speed, the received light distribution is uniform in the Y direction.

In step S3, latitudinal parallax signals are calculated from the second signal group acquired in step S2. The calculation of the latitudinal parallax signals will be described with reference to FIG. 5 and FIG. 8A. FIG. 8A schematically illustrates partial regions of the pupil of one pixel out of the plurality of pixels in FIG. 2 when the latitudinal parallax signals S_A and S_B, and an image capturing signal S_ALL, which is a summation signal of S_A and S_B, are acquired.

First, the first signal group is obtained from the PD 201a and the PD 201b of FIG. 5 for each pixel. Then, the latitudinal parallax signals S_A and S_B in FIG. 8A corresponding to the pupil partial region 301 and the pupil partial region 302 of the imaging optical system can be calculated from the obtained first signal group. In the present embodiment, a plurality of latitudinal parallax images of different pupil partial regions are acquired by an image sensor in which a plurality of pixels provided with a plurality of PDs for receiving luminous flux passing through the different pupil partial regions of an imaging optical system are arranged.

When light passes through different pupil partial regions, the viewpoint is different. Therefore, a plurality of latitudinal parallax images of different viewpoints are acquired by the image sensor 14 of the present embodiment. Further, by summing up the latitudinal parallax signals S_A and S_B of the PD 201a and the PD 201b in FIG. 4 for each pixel, an image capturing signal S_ALL having the resolution of the number of effective pixels in FIG. 8A can be generated.

In step S4, the longitudinal parallax signals S_C and S_D are calculated using the first signal group acquired in step ST and the second signal group acquired in step S2. The calculation of the longitudinal parallax signals will be described with reference to FIG. 8B and FIG. 9A and FIG. 9B. FIG. 8B schematically illustrates a partial region of one pupil out of the plurality of pixels in FIG. 2B when acquiring the longitudinal parallax signals S_C and S_D and an image capturing signal S_ALL which is a summation signal of S_C and S_D calculated from the first signal group and the second signal group acquired in steps S1 and S2.

Figure 9B:
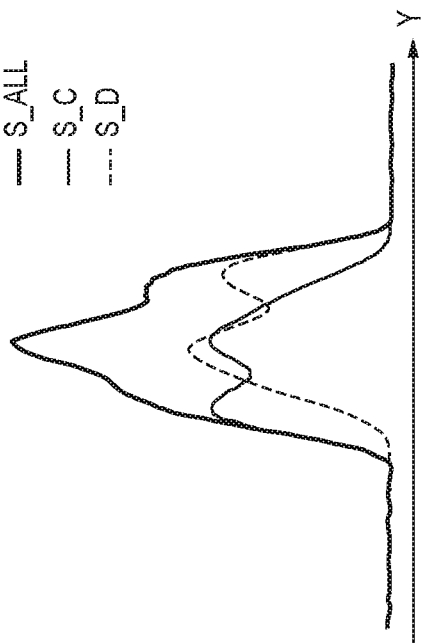
FIG. 9A and FIG. 9B are diagrams illustrating examples of longitudinal parallax signals in the first embodiment.
Figure 9A:
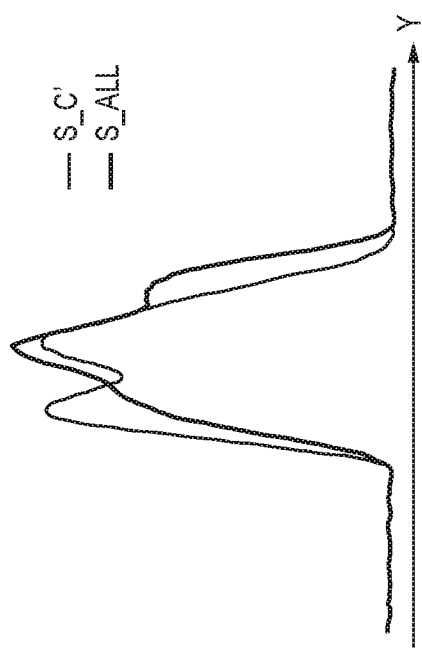

In addition, FIGS. 9A and 9B illustrate the summation signal of the photoelectric converters 201a and 201b when the first shutter operation and the second shutter operation are used and two bars are subjects. The horizontal axis in FIGS. 9A and 9B indicates the Y direction position in FIGS. 6A and 6B and FIGS. 7A and 7B, and the vertical axis indicates the signal strength. FIG. 9A illustrates the image capturing signal S_ALL calculated in step S3 and the first signal group S_C' acquired in step S1. Also illustrated in FIG. 99 are the longitudinal parallax signal S_C calculated from S_C' in a manner to be described later, and the longitudinal parallax signal S_D calculated using S_ALL and S_C.

In the complex lens 151 in FIGS. 6A and 6B, if the partial region 182 of the pupil and the partial region 181 of the pupil have the same region size and the region into which the pupil partial region 181 and the pupil partial region 182 are combined forms the pupil region 180, S_D can be obtained by the following equation.

$$S\_D = S\_ALL - S\_C \quad (1)$$

As illustrated in FIG. 9B, S_D is a symmetrical mirror image of S_C, and the summation signal of S_C and S_D (the total area of S_C and S_D) becomes the image capturing signal S_ALL.

Next, a method of acquiring S_C will be described. FIG. 9A illustrates the image capturing signal S_ALL when the second shutter operation at the central image height of the image sensor 14 is used at high speed and the longitudinal parallax signal S_C' when the first shutter operation is used at high speed. S_ALL is obtained by photoelectrical conversion of the luminous flux from the pupil region 180 of the complex lens 151. As described above, the longitudinal parallax signal is obtained by photoelectrically converting the luminous flux from the partial region 181 of the pupil of the complex lens 151 as illustrated in FIG. 6B, but the amount of light is unbalanced from the driving time t1 to t3 of the first shutter operation. As described above, in the complex lens 151, if the partial region 182 of the pupil and the partial region 181 of the pupil have the same region size and the region into which the pupil partial region 181 and the pupil partial region 182 are combined forms the pupil region 180. Further, in the case of the central image height as in FIGS. 9A and 9B, the longitudinal parallax signal S_C can be obtained by the following equation.

$$S\_C = S\_C' \times \left\{ \left( \int_0^y \frac{S\_ALL}{2} \right) \Big/ \int_0^y S\_C' \right\} \quad (2)$$

In addition, by setting the ISO sensitivity at the time of using the first shutter operation to be a lower sensitivity than the ISO sensitivity at the time of using the second shutter operation, it is possible to obtain the same effect as in the above-mentioned equation (2). Therefore, in the present embodiment, the longitudinal parallax signal is acquired by using the first shutter operation and the second shutter operation.

The longitudinal parallax signals S_C and S_D can be acquired as described above. The pupil region of the image capturing signal S_ALL obtained by adding up the longitudinal parallax signals S_C and S_D and the pupil region of the image capturing signal S_ALL obtained by adding the latitudinal parallax signals S_A and S_B calculated in step S3 are the same size.

As described above, the signals acquired in step S1 and the corresponding region of the pupil of the complex lens 151 are determined by the angle of the shielding by the light shielding portions (the mechanical rear curtain 156 and the electronic front curtain 155) whose positions are shifted on the optical axis direction. As can be seen from the positional relation in FIG. 6A, the angle of light beams that are shielded by the light shielding portions (the mechanical rear curtain 156 and the electronic front curtain 155) whose positions are shifted in the optical axis direction is determined by the amount of deviation of the two light shielding portions in the optical axis direction and the widths of the apertures (in the Y-axis direction). Therefore, by changing the width (in the Y-axis direction) of the opening of the two light shielding portions, the state of shielding can be changed, and a signal corresponding to a partial region of the pupil in the complex lens 151 different from the case described above can be obtained. In the present embodiment, the width of the opening of the two light shielding portions may be set so that the parallax amounts of the longitudinal parallax signals S_C and S_D (the angular difference between the corresponding luminous flux centers) become the largest.

In step S5, the reliability of the longitudinal parallax signals S_C and S_D is determined. For the longitudinal parallax signals S_C and S_D, since two images acquired in time series by two types of shutter operations (the first shutter operation and the second shutter operation) are used, the reliability is determined by comparing the two images. In the present embodiment, as the reliability determination, four determinations are performed: contrast information determination, defocus information determination, edge inclination degree determination, and exposure amount determination. When at least one of the above-mentioned four determinations is a determination to be not good (NG), it is determined that the reliability of the parallax image is low, and the flow is terminated without performing the four parallax image generation.

First, contrast information is determined. The contrast information of the longitudinal parallax signal S_C or S_D acquired by using the first shutter operation at high speed and of the pupil region S_ALL acquired by adding latitudinal parallax signals S_A and S_B obtained by using the second shutter operation are compared. The direction in which the contrast is acquired is a direction orthogonal to the driving direction of the first shutter operation. When the longitudinal parallax signals are acquired, two images are acquired in time series by two types of shutter operations (the first shutter operation and the second shutter operation), but if the longitudinal parallax signal is in a direction orthogonal to the driving direction of the first shutter operation, the contrast information of the two images does not significantly differ unless there is an influence due to the different times. If there is a difference between the contrast information of the two images, for example, the position or brightness of the subject will have changed due to a panning operation, subject movement, or the like. As described above, if the difference in the contrast information is small, it is determined to be OK, and if the difference is large, it is determined to be NG.

Next, a defocus information determination for determining a difference in defocus amount between the first defocus amount calculated from the latitudinal parallax signals S_A and S_B and the second defocus amount calculated from the longitudinal parallax signals S_C and S_D is performed. A known method is used to calculate the first defocus amount and the second defocus amount. Further, S_Ca and S_Cb of FIGS. 10A and 10B, which will be described later, may be used as the latitudinal parallax signals. When the longitudinal parallax signals are acquired, two images are acquired in time series by the two types of shutter operations (the first shutter operation and the second shutter operation), but the difference between the two defocus amounts is small as long as there is no influence due to the time difference. If there is a difference in the defocus amount, for example, the position or brightness of the subject will have changed due to a panning operation, subject movement, or the like. As described above, if the difference in defocus amount is small, it is determined to be OK, and if the difference is large, it is determined to be NG.

Next, the exposure amount of S_AB (S_A+S_B) acquired in the second shutter operation and S_CD (S_C+S_D) acquired in the first shutter operation are determined. In the present embodiment, in order to acquire the longitudinal parallax signals S_C and S_D, first, the parallax signals of S_C' and S_ALL in FIG. 9A are acquired. Although for S_C' and S_ALL, there is a difference between the first shutter operation and the second shutter operation, as described above, the opening width of the two light shielding portions of the first shutter operation is decided upon prioritizing the parallax amount. Therefore, the exposure amounts of the two images are different. However, since the difference in the exposure amount can be known in advance, it is stored as a correction value for determining the exposure amount. Further, in order to acquire the parallax amount, an F value is set to be the same for capturing in the first shutter operation and the second shutter operation.

Therefore, in this determination, the difference between the exposure amounts of S_C' acquired in the first shutter operation and acquired in the second shutter operation is determined. Although two images are acquired in time series by two types of shutter operations (the first shutter operation and the second shutter operation), if there is no influence due to the difference in time, the difference between a value obtained by multiplying the exposure amount of S_C' by the correction value and the exposure amount of S_ALL will be small. Note that if there is a difference in the exposure amount, for example, the position or brightness of the subject will have changed due to a panning operation, a subject movement, or the like. As described above, if the difference in the exposure amount is small, it is determined to be OK, and if the difference is large, it is determined to be NG. Since the correction value to be multiplied with the exposure amount of differs depending on the F value, the height of the image for which to perform the determination, and the distance in the optical axis direction of the exit pupil of the imaging optical system, the correction value may be stored in correspondence with these parameters.

Finally, a difference in the inclination degree of an edge portion present at substantially the same position of S_A, S_B, or S_AB acquired in the second shutter operation and S_C, S_D, or S_CD acquired in the first shutter operation is determined. In the present embodiment, it is assumed that the second shutter operation is an electronic shutter, and is a slit rolling shutter that sequentially performs a reset read. Therefore, when a high-speed moving subject or the like is captured, slit rolling distortion, in which the subject becomes obliquely distorted, occurs due to a read out time difference between different vertical positions of the sensor. On the other hand, the first shutter operation is a shutter operation in which a slit is formed and exposure is performed by electric charge reset and exposure of the electronic shutter included in the image sensor 14 and the rear curtain which is the mechanical shutter 12. Since the mechanical shutter is used as the rear curtain, the distortion is small as compared with the above-described second shutter operation. In the edge determination of the present embodiment, whether or not slit rolling distortion occurs is determined from the difference in the degree of edge inclination. As described above, when the difference in the degree of edge inclination is small, it is considered that is no influence of the slit rolling distortion, and it is determined to be OK, and when the difference in the degree of edge inclination is large, it is considered that there is an influence of the slit rolling distortion, and it is determined to be NG.

As described above, the reliability of the longitudinal parallax signal is determined from the four determinations of the contrast information determination, the defocus information determination, the edge inclination degree determination, and the exposure amount determination. If at least one of the four determinations is NG, the reliability of the longitudinal parallax signal is determined to be NG. When all of the four determinations are OK, the reliability of the longitudinal parallax signal is determined to be OK. After the reliability of the longitudinal parallax signal is determined, the process proceeds to step S6.

In step S6, it is determined whether or not to generate four parallax images according to the result of the reliability determined in step S5. If the decision result in the step S5 is NG, it is determined that the reliability of the longitudinal parallax signal is low, and the flow of the present embodiment is terminated without generating the four parallax images. Also, if the decision result in the step S5 is OK, it is determined that the reliability of the longitudinal parallax signal is high, and step S7 is transitioned to in order to generate the four parallax images.

In step S7, when it is determined in step S5 that the reliability is high, the four parallax images are generated. A method of generating four parallax images from the latitudinal parallax signals and S_B acquired in step S3 and the longitudinal parallax signals S_C and S_D acquired in step S4 will be described with reference to FIG. 10A, FIG. 10B, and FIG. 11.

Figure 10B:
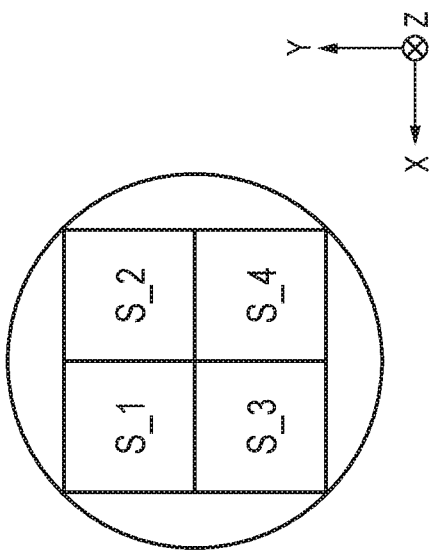
FIG. 10A and FIG. 10B are explanatory diagrams for pupil partial regions at a time of acquiring four parallax signals in the first embodiment.
Figure 10A:
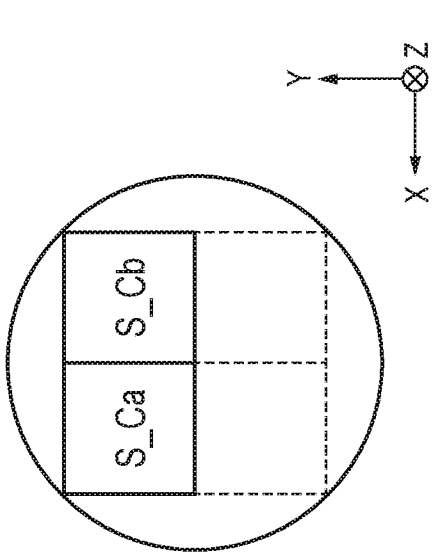

FIGS. 10A and 10B schematically illustrate partial regions of a pupil of one of the plurality of pixels in FIG. 2B when acquiring the four parallax signals. FIG. 10A illustrates signals S_Ca and S_Cb acquired when the longitudinal parallax signals S_C and S_D acquired by using the first shutter operation at high speed are divided for each of the latitudinal parallax signals S_A and S_B. FIG. 10B illustrates four parallax signals S_1, S_2, S_3, and S_4) calculated using S_A and S_B acquired in FIG. 8A and S_Ca and S_Cb acquired in FIG. 10A. In the present embodiment, of the four parallax signals (S_1, S_2, S_3, S_4), the parallax signal of the partial region of the pupil in the positive X direction and the positive Y direction as viewed from the pupil center of FIG. 10B is S_1. The parallax signal of the partial region of the pupil in the minus X direction and the plus Y direction is S_2, the parallax signal of the partial region of the pupil in the plus X direction and the minus Y direction is S_3, and the parallax signal of the partial region of the pupil in the minus X direction and the minus Y direction is S_4. The four parallax signals (S_1, S_2, S_3, and S_4) can be calculated by the following equations.

$$S\_1 = S\_Ca \tag{3-1}$$

$$S\_2 = S\_C \tag{3-2}$$

$$S\_3 = S\_A - S\_Ca \tag{3-3}$$

$$S\_4 = S\_B - B\_Cb \tag{3-4}$$

As described above, the four parallax signals can be generated using the latitudinal parallax signals and the longitudinal parallax signals acquired from the photoelectric converters arranged plurally in the image sensor 14 by using the first shutter operation and the second shutter operation.

FIG. 11 illustrates an example of four parallax images in the present embodiment. FIG. 11 illustrates four parallax images (P_1, P_2, P_3, P_4) generated from the four parallax signals (S_1, S_2, S_3, S_4) described above. The two-dot dashed line in FIG. 11 represents the xy-axis of each parallax image. The solid lines in FIG. 11 indicate an outline of a part of the subject images (400, 410) in the parallax image P_1, and the solid double-sided arrows indicate the distance from the xy-axes in the parallax image P_1 to the solid lines. The broken lines in FIG. 11 indicate an outline of a part of the subject images (400 and 410) in the parallax images P_2 and P_4, and indicate the shift from the parallax image P_1 serving as a reference.

In the example of FIG. 11, there is an image shift for the subject images 400 and 410, and the positions are shifted in the horizontal direction and the vertical direction by the amounts indicated by the arrows 401 and 402, respectively, taking the parallax image P_1 as a reference. Considering the parallax image P_1 as a reference, the subject image 410 in the parallax image P_2 is image shifted in the positive x-axis direction by the amount indicated by the arrow 401. In the parallax images P_1 and P_2, it can be seen that the surface area of the side surface 411 of the subject 410 increases, the overlapping portion with the subject 400 ceases to be present, d the left-right parallax is changed. Meanwhile, the subject image 400 in the parallax image is image shifted in the negative y-axis direction by the amount indicated by the arrow 402. In the parallax images P_1 to P_3, it can be seen that the area of the upper surface 412 of the subject 400 is reduced and the vertical parallax is changed. Also, considering the parallax image P_1 as a reference, it can be seen that the subject images 400 and 410 in the parallax image P_4 are image shifted by the amounts indicated by the arrows 401 and 402. When the generated four parallax images are successively changed from the parallax image P_1 to the parallax image P_2, the parallax image P_4, the parallax image P_3, and the parallax image P_1 with the parallax image P_1 as a reference, it is understood that the viewpoint is changed rotationally. The image shift amounts are sequentially changed in the x-axis plus direction, the y-axis minus direction, the x-axis minus direction, and the y-axis plus direction. After the four parallax images are generated as described above, the flow of the present embodiment is terminated.

Even in the image sensor 14 which has a pixel group divided in only one direction as described above, it is possible to acquire the latitudinal parallax signals and the longitudinal parallax signals substantially simultaneously by using the first shutter operation and the second shutter operation. In addition, four parallax images can be generated from the latitudinal parallax signals and the longitudinal parallax signals.

Second Embodiment

The second embodiment is different from the first embodiment in that the number of divisions of the longitudinal parallax signal is greater than 2. In the first embodiment, the number of divisions of the longitudinal parallax signal has been described as 2, but in the present embodiment, a method of acquiring a longitudinal parallax signal having 3 divisions will be described with reference to FIG. 12A, FIG. 12B, and FIG. 13.

Figure 12A:
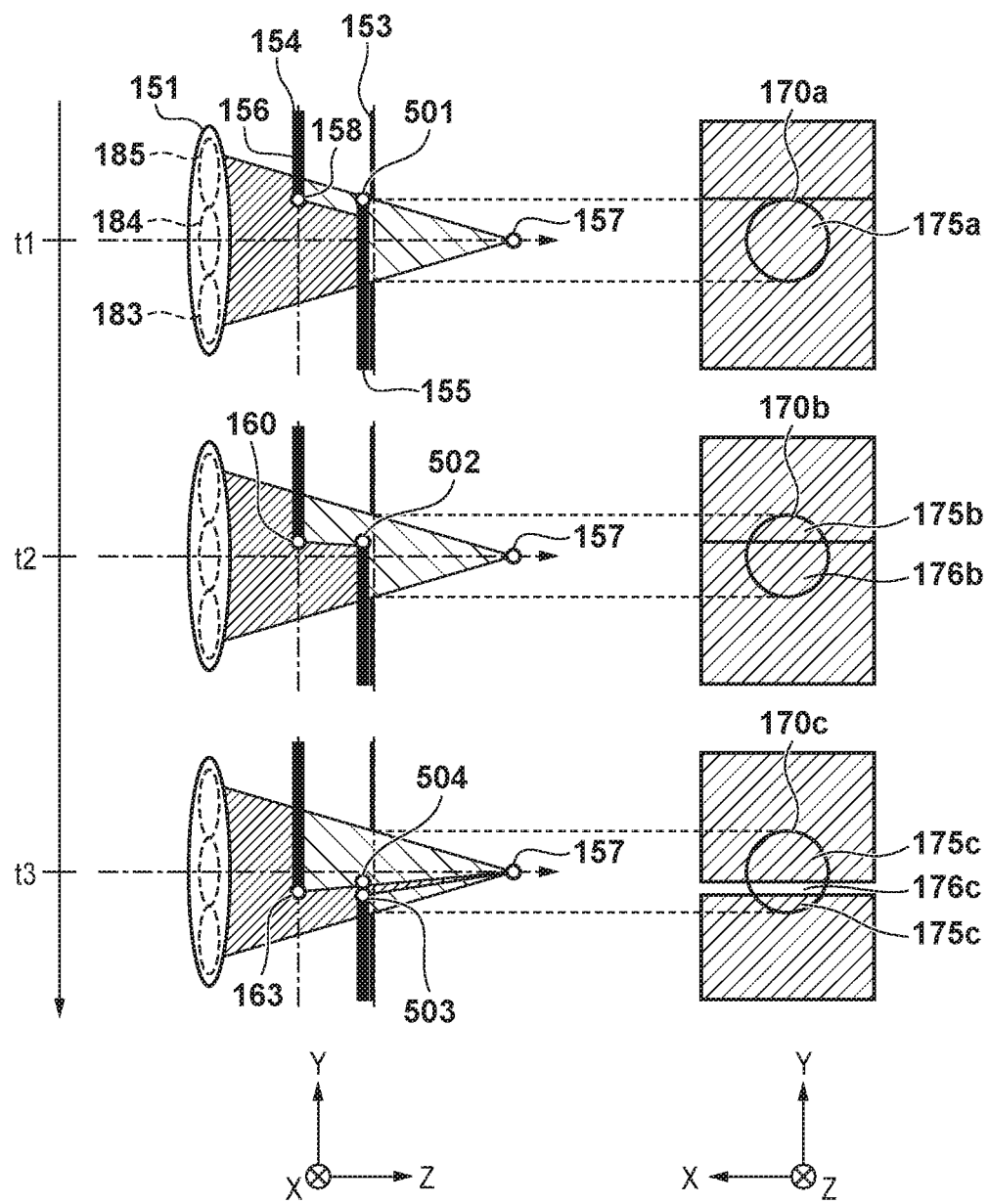
FIGS. 12A and 12B are diagrams for explaining a blurred image at the time of driving a first shutter in a second embodiment.
Figure 12B:
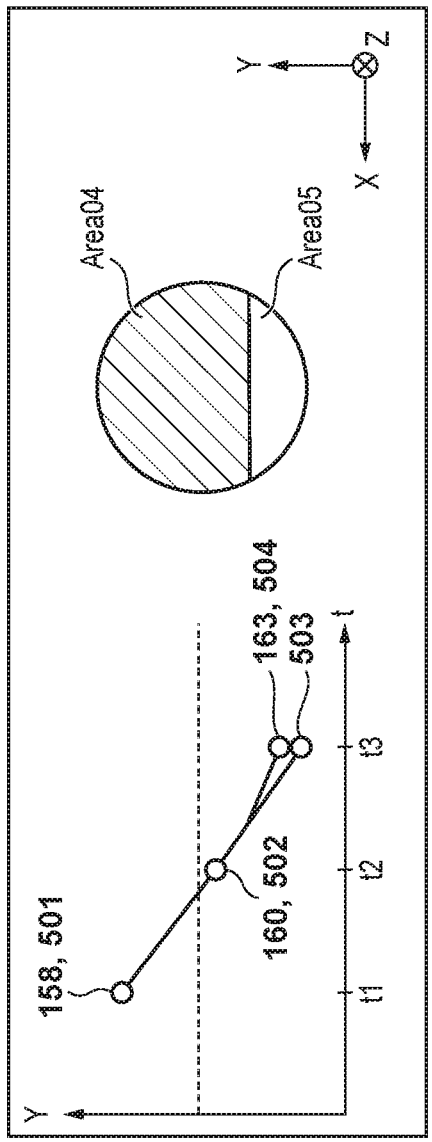

FIGS. 12A and 12B are diagrams schematically illustrating a state which a blurred image is shielded in the first shutter operation when a focus position is located at a point 157 behind the image sensor plane at certain times (t1, t2, or t3), similarly to FIGS. 6A and 6B. FIGS. 12A and 12B illustrate states in which the opening formed by the electronic front curtain 155 and the mechanical rear curtain 156 is narrower as compared with FIGS. 6A and 6B. Thus, the pupil of the complex lens 151 can be divided into three partial regions 183, 184, and 185.

First, an explanation will be given with reference to the view for time t1 in FIG. 12A. At time t1, an upper end of the electronic front curtain 155 is positioned at an upper end 501 of the blurred image formed on the image sensor plane 153, and the lower end of the mechanical rear curtain 156 is positioned at a upper end 158 of the blurred image formed on the mechanical shutter plane 154. At this time, the luminous flux from the complex lens 151 is blocked by the electronic front curtain 155 and the mechanical rear curtain 156. Most of the blurred image 170a on the image sensor plane 153 at this time is blocked by the electronic front curtain 155 and the mechanical rear curtain 156 as illustrated on the right side for time t1 in FIG. 12A. In FIGS. 12A and 12B, the luminous flux from the complex lens 151 is blocked by the electronic front curtain 155 and the mechanical rear curtain 156 even at time t2.

Next, an explanation will be given with reference to the view for time t3 in FIG. 12A. At the time t3, the blurred image formed on the image sensor plane 153 is shielded by the lower end 163 of the mechanical rear curtain 156 and the upper end 503 of the electronic front curtain 155. At this time, an opening of the first shutter operation on the image sensor plane 153 is formed by 504, at which the lower end of the mechanical rear curtain 156 is projected onto the image sensor plane 153, and the upper end 503 of the electronic front curtain. The blurred image 170c on the image sensor plane 153 at this time forms an opening 176c as illustrated on the right side for time t3 in FIG. 12A, and other portions are partially obstructed by the electronic front curtain 155 and the mechanical rear curtain 156 (175c).

As described above, when capturing using the first shutter operation is performed, the blurred image is shielded. Next, the manner in which the pupil of the complex lens 151 is shielded will be described with reference to FIG. 12B.

FIG. 12B illustrates a temporal change of an opening formed by the electronic front curtain 155 and the mechanical rear curtain 156 on the image sensor plane 153 in FIG. 12A, and schematically illustrates a pupil of the complex lens 151 when the first shutter operation is used. Reference numerals 158 to 504 in FIG. 12B are the same as reference numerals 158 to 504 in FIG. 12A. The opening at each time is illustrated on the vertical axis. At time t1 and time t2, all luminous flux is blocked by the electronic front curtain 155 and the mechanical rear curtain 156. At time t3, since the lower end 163 of the mechanical rear curtain 156 is projected onto 504 of the image sensor plane 153, the opening in the image sensor plane 153 becomes 503-504.

As a result, the amount of light is unbalanced even more than in FIG. 6B, and the blurred image on the image sensor plane 153 is divided into a region Area04 that is shielded in the first shutter operation and a region Area05 that is not shielded. Luminous flux from the partial region 183 of the pupil of the complex lens 151 is being received.

As described above, by narrowing the opening formed by the electronic front curtain 155 and the mechanical rear curtain 156 more than in FIGS. 6A and 6B, it is possible to acquire a longitudinal parallax signal corresponding to the partial region 183 of the pupil of the complex lens 151. Let S_E be a longitudinal parallax signal that can be acquired at this time. While not illustrated, by widening the opening formed by the electronic front curtain 155 and the mechanical rear curtain 156 more than in FIGS. 6A and 6B, it is possible to acquire a longitudinal parallax signal corresponding to the partial regions 183+184 of the pupil of the complex lens 151. Assuming that a longitudinal parallax signal that can be acquired at this time is S_EF, a longitudinal parallax signal S_F corresponding to the partial region 184 of the pupil of the complex lens 151 is calculated by the following equation.

$$S\_F = S\_EF - S\_E \quad (4)$$

In the present embodiment, a total of six parallax signals obtained by division into three in the row direction and into two in the column direction can be acquired by the longitudinal parallax signals S_E and S_F obtained by the above methods and the latitudinal parallax signals S_A and S_B obtained by the PD 201a and PD 201b. A method of acquiring six parallax signals will be described with reference to FIGS. 13A to 13C. In the present embodiment, the method of dividing the longitudinal parallax signal into three parts is described, but the opening formed by the electronic front curtain 155 and the mechanical rear curtain 156 may be further narrowed to divide into more than three parts.

Figure 13C:
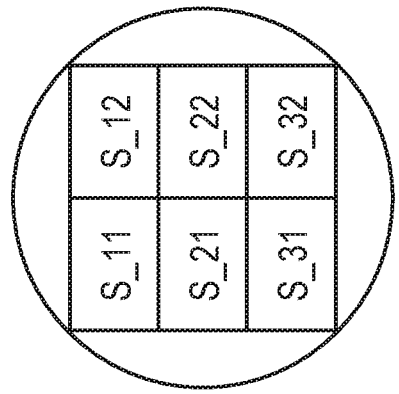
FIGS. 13A to 13C are explanatory diagrams for pupil partial regions at a time of acquiring six parallax signals in the second embodiment.
Figure 13B:
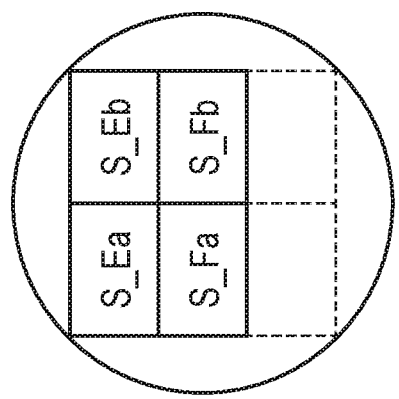
Figure 13A:
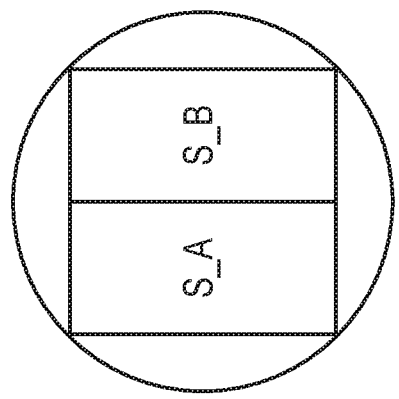

FIGS. 13A to 13C, similarly to FIG. 8A and FIG. 8B and FIG. 10A and FIG. 10B, schematically illustrate partial regions of a pupil of one of the plurality of pixels in FIG. 2B when acquiring the six parallax signals. FIG. 13A illustrates the latitudinal parallax signal S_A and S_B acquired from the PD 201a and the PD 201b using the second shutter operation at high speed in the same manner as FIG. 10A. FIG. 13B illustrates the longitudinal parallax signals and S_F acquired by using the first shutter operation described above at high speed. Further, in FIG. 13B, S_Ea, S_Eb, S_Fa, and S_Fb acquired from PD 201a and PD 201b can be acquired separately. FIG. 13C illustrates six parallax signals (S_11, S_12, S_21, S_22, S_31, S_32) calculated using S_A, S_B, S_Ea, S_Eb, S_Fa, and S_Fb acquired in FIG. 13A and FIG. 13B. The six parallax signals can be calculated by the following equation.

$$S\_11 = S\_Ea \quad (5\text{-}1)$$

$$S\_12 = S\_Eb \quad (5\text{-}2)$$

$$S\_21 = S\_Fa \quad (5\text{-}3)$$

$$S\_22 = S\_Fb \quad (5\text{-}4)$$

$$S\_31 = S\_A - (S\_Ea + S\_Fa) \quad (5\text{-}5)$$

$$S\_32 = S\_B - (S\_Eb + S\_Fb) \quad (5\text{-}6)$$

As described above, the six parallax signals can be generated using the latitudinal parallax signals and the longitudinal parallax signals acquired from the photoelectric converters arranged plurally in the image sensor 14 by using the first shutter operation and the second shutter operation. Further, in the present embodiment, description has been made on the assumption that the plurality of photoelectric conversion regions are arranged in the latitudinal direction on the paper surface, the shutter driving direction is longitudinal direction on the paper surface, and the direction is different from the direction in which the plurality of photoelectric conversion regions are arranged. However, the direction in which the plurality of photoelectric conversion regions are arranged and the shutter driving direction may be the same. In this case, it is possible to acquire a parallax signal divided into a plurality of parts only in the direction in which the plurality of photoelectric converters are arranged, that is, in the shutter driving direction. With such a configuration, the division of the pupil region by the plurality of photoelectric converters and the division of the pupil region by the slit width using the first shutter operation and the second shutter operation can be performed in the same direction (shutter drive direction). As a result, it is possible to receive the luminous flux from a pupil partial region which is divided even more than the number of the plurality of photoelectric converters, and thus it is possible to acquire even more parallax signals than the number of the plurality of photoelectric converters.

Even in the image sensor 14 which has a pixel group divided in only one direction as described above, it is possible to generate six parallax images from the latitudinal parallax signals and the longitudinal parallax signals by using the first shutter operation and the second shutter operation.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-215785, filed Nov. 16, 2018, which is hereby incorporated by reference herein in its entirety.

What is claimed is:

1. An image capturing apparatus, comprising:
an image sensor in which a plurality of pixels provided with a plurality of photoelectric converters for receiving luminous flux passing through different pupil regions of an imaging optical system are arranged;
a mechanical shutter configured to shield the image sensor from light; and
a generation circuit configured to generate a parallax image from signals acquired from the plurality of photoelectric converters,
wherein
the image sensor and the mechanical shutter realize:
a first shutter operation by a first front curtain for starting exposure of a pixel, and a first rear curtain for ending the exposure of the pixel whose exposure was started by the first front curtain, the first rear curtain being arranged at a distance of a first shift amount from the first front curtain in a direction along an optical axis of the imaging optical system and
a second shutter operation by a second front curtain for starting exposure of the pixel, and a second rear curtain for ending the exposure of the pixel whose exposure was started by the second front curtain, the second rear curtain being arranged at a distance of a second shift amount, which is smaller than the first shift amount, from the second front curtain in a direction along an optical axis of the imaging optical system, and
the generation circuit generates parallax images having a parallax in a driving direction of the first shutter operation and the second shutter operation by using both of a first signal group acquired from the plurality of photoelectric converters by the first shutter operation and a second signal group acquired from the plurality of photoelectric converters by the second shutter operation.

2. The image capturing apparatus according to claim 1, wherein the first front curtain is realized by an operation of sequentially resetting the plurality of photoelectric converters, and the first rear curtain is realized by a rear curtain of the mechanical shutter.

3. The image capturing apparatus according to claim 1, wherein the first front curtain is realized by a front curtain of the mechanical shutter, and the first rear curtain is realized by an operation of reading a signal from a photoelectric converter.

4. The image capturing apparatus according to claim 1, wherein the second front curtain is realized by an operation of sequentially resetting the plurality of photoelectric converters, and the second rear curtain is realized by an operation of reading a signal from a photoelectric converter.

5. The image capturing apparatus according to claim 4, wherein the second shift amount is zero.

6. The image capturing apparatus according to claim 1, wherein the second front curtain is realized by a front curtain of the mechanical shutter, and the second rear curtain is realized by a rear curtain of the mechanical shutter.

7. The image capturing apparatus according to claim 1, wherein a direction in which the plurality of photoelectric converters in the pixel are arranged and a driving direction of the first and second shutter operations are different directions.

8. The image capturing apparatus according to claim 1, wherein a direction in which the plurality of photoelectric converters in the pixel are arranged and a driving direction of the first and second shutter operations are the same direction.

9. The image capturing apparatus according to claim 1, further comprising: a reliability determination circuit configured to determine a reliability of the first signal group and the second signal group; wherein the parallax image is generated by the generation circuit in a case where it is determined by the reliability determination circuit that the reliability is high; and wherein the parallax image is not generated by the generation circuit in a case where it is determined by the reliability determination circuit that the reliability is low.

10. The image capturing apparatus according to claim 9, wherein the reliability determination circuit determines the reliability based on a difference in contrast between the first signal group and the second signal group in a direction orthogonal to the driving direction of the first shutter operation.

11. The image capturing apparatus according to claim 9, wherein the reliability determination circuit determines the reliability based on a difference between a first defocus amount calculated from a parallax image having a parallax in the driving direction of the first shutter operation and a second defocus amount calculated from a parallax image having a parallax in a direction orthogonal to the driving direction of the first shutter operation.

12. The image capturing apparatus according to claim 9, wherein the reliability determination circuit determines the reliability based on a difference between the exposure amounts of the first signal group and the second signal group.

13. The image capturing apparatus according to claim 9, wherein the reliability determination circuit determines the reliability based on an inclination degree of an edge portion of the first signal group and the second signal group.

14. A method of controlling an image capturing apparatus having an image sensor in which a plurality of pixels provided with a plurality of photoelectric converters for receiving luminous flux passing through different pupil regions of an image forming optical system are arrayed, and a mechanical shutter for shielding the image sensor from light, the method comprising:
by the image sensor and the mechanical shutter, performing a first shutter operation by a first front curtain for starting exposure of a pixel, and a first rear curtain for ending the exposure of the pixel whose exposure was started by the first front curtain, the first rear curtain being arranged at a distance of a first shift amount from the first front curtain in a direction along an optical axis of the imaging optical system, and a second shutter operation by a second front curtain for starting exposure of the pixel, and a second rear curtain for ending the exposure of the pixel whose exposure was started by the second front curtain, the second rear curtain being arranged at a distance of a second shift amount, which is smaller than the first shift amount, from the second front curtain in a direction along an optical axis of the imaging optical system; and
generating a parallax image from signals acquired from the plurality of photoelectric converters,
wherein the generating generates parallax images having a parallax in a driving direction of the first shutter operation and the second shutter operation by using both of a first signal group acquired from the plurality of photoelectric converters by the first shutter operation and a second signal group acquired from the plurality of photoelectric converters by the second shutter operation.

15. A non-transitory computer-readable storage medium storing a program for causing a computer to execute a method of controlling an image capturing apparatus having an image sensor in which a plurality of pixels provided with a plurality of photoelectric converters for receiving luminous flux passing through different pupil regions of an image forming optical system are arrayed, and a mechanical shutter for shielding the image sensor from light, the method comprising:

by the image sensor and the mechanical shutter, performing a first shutter operation by a first front curtain for starting exposure of a pixel, and a first rear curtain for ending the exposure of the pixel whose exposure was started by the first front curtain, the first rear curtain being arranged at a distance of a first shift amount from the first front curtain in a direction along an optical axis of the imaging optical system, and a second shutter operation by a second front curtain for starting exposure of the pixel, and a second rear curtain for ending the exposure of the pixel whose exposure was started by the second front curtain, the second rear curtain being arranged at a distance of a second shift amount, which is smaller than the first shift amount, from the second front curtain in a direction along an optical axis of the imaging optical system; and generating a parallax image from signals acquired from the plurality of photoelectric converters, wherein the generating generates parallax images having a parallax in a driving direction of the first shutter operation and the second shutter operation by using both of a first signal group acquired from the plurality of photoelectric converters by the first shutter operation and a second signal group acquired from the plurality of photoelectric converters by the second shutter operation.

\* \* \* \* \*